(12) United States Patent
Shin et al.

(10) Patent No.: US 10,930,670 B2
(45) Date of Patent: Feb. 23, 2021

(54) SEMICONDUCTOR DEVICE AND MANUFACTURING METHOD OF THE SEMICONDUCTOR DEVICE

(71) Applicant: SK hynix Inc., Icheon-si (KR)

(72) Inventors: Wan Sup Shin, Seongnam-si (KR); Ki Hong Lee, Suwon-si (KR); Jae Jung Lee, Seoul (KR); Young Geun Jang, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/425,147

(22) Filed: May 29, 2019

(65) Prior Publication Data

US 2020/0135755 A1   Apr. 30, 2020

(30) Foreign Application Priority Data

Oct. 25, 2018   (KR) ........................ 10-2018-0128499

(51) Int. Cl.
*H01L 27/11582*   (2017.01)
*H01L 21/8234*   (2006.01)

(52) U.S. Cl.
CPC .................. *H01L 27/11582* (2013.01); *H01L 21/823412* (2013.01); *H01L 21/823487* (2013.01)

(58) Field of Classification Search
CPC ....... H01L 27/11582; H01L 21/823487; H01L 27/11551; H01L 27/11578
See application file for complete search history.

(56) References Cited

U.S. PATENT DOCUMENTS

| 9,859,293 | B2 * | 1/2018 | Lee | ..................... H01L 23/5226 |
| 10,283,513 | B1 * | 5/2019 | Zhou | ............... H01L 21/823487 |
| 2016/0190155 | A1 * | 6/2016 | Lee | .................. H01L 27/11565 |
| | | | | 438/268 |
| 2018/0122814 | A1 | 5/2018 | Baraskar et al. | |

FOREIGN PATENT DOCUMENTS

KR   1020170136363 A   12/2017

* cited by examiner

*Primary Examiner* — Hsien Ming Lee

(74) *Attorney, Agent, or Firm* — William Park & Associates Ltd.

(57) ABSTRACT

A semiconductor device, and a method of manufacturing the semiconductor device, the method includes forming a first stack structure penetrated by first channel structures, forming electrode patterns surrounding second channel structures and separated from each other by first slits and second slits, the second channel structures coupled to the first channel structures, and the second slits comprising a different width from the first slits, filling each of the first slits and the second slits with an insulating material to cover sidewalls of the electrode patterns, and forming third slits passing through the insulating material in each of the second slits and extending to pass through the first stack structure.

15 Claims, 26 Drawing Sheets

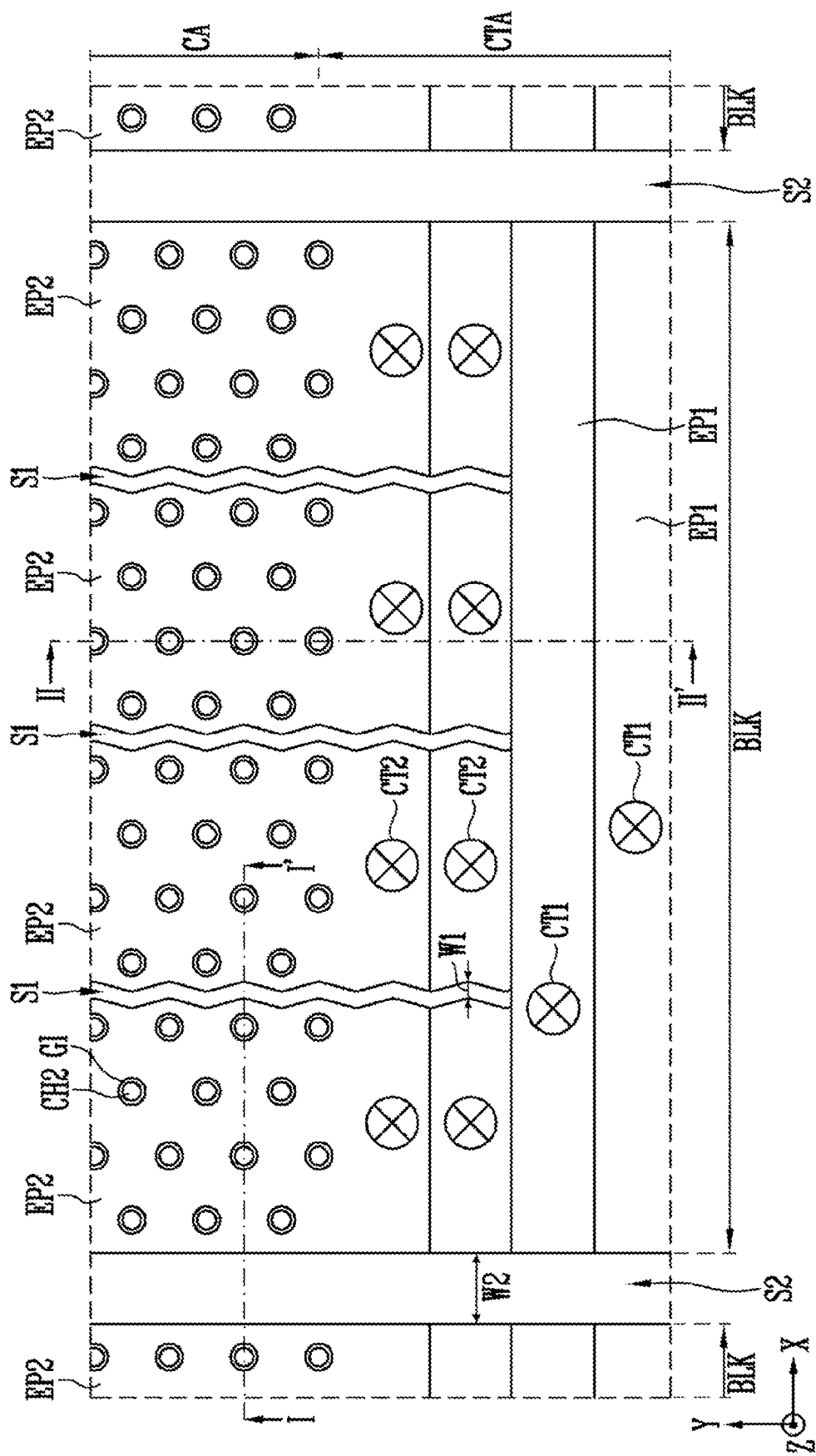

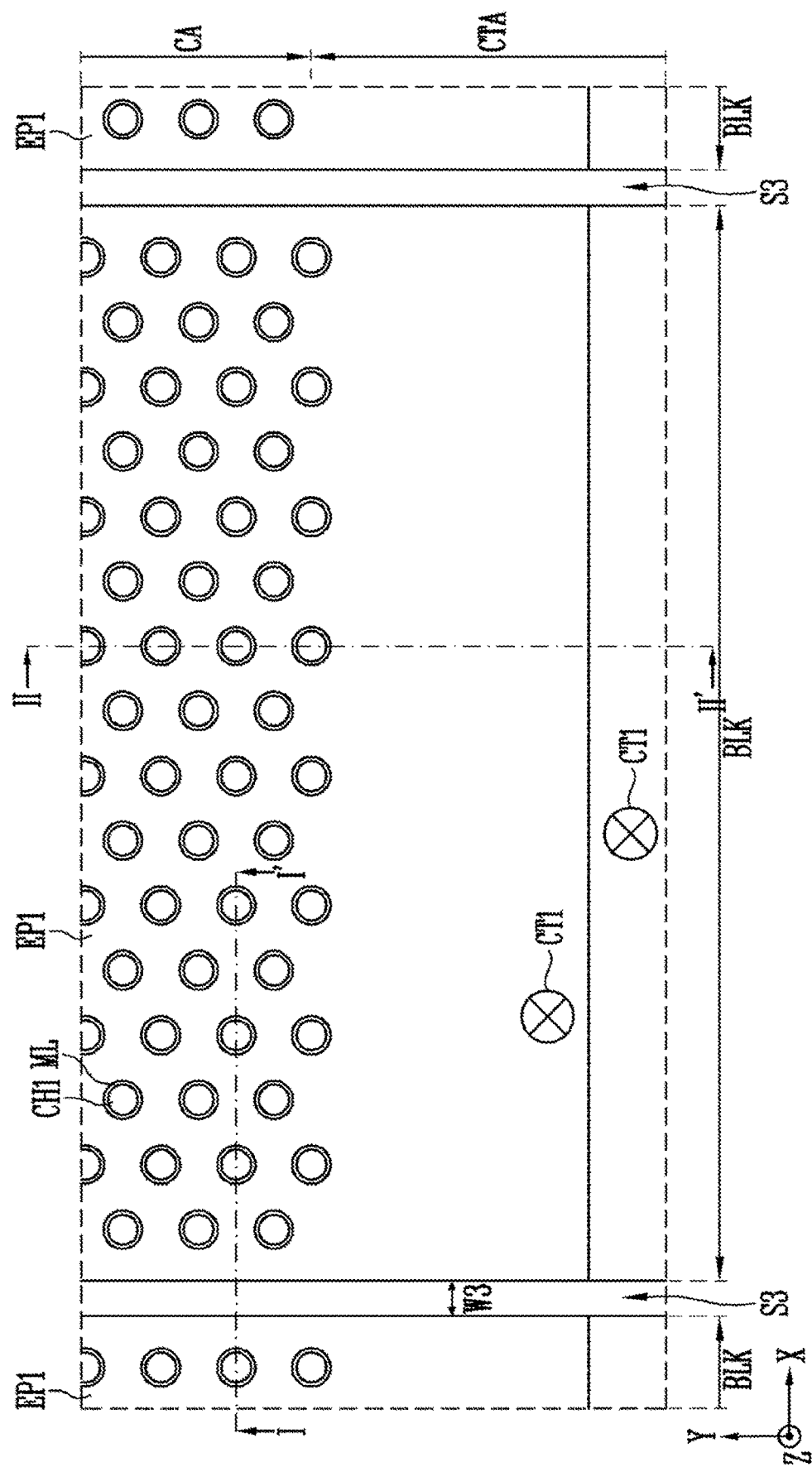

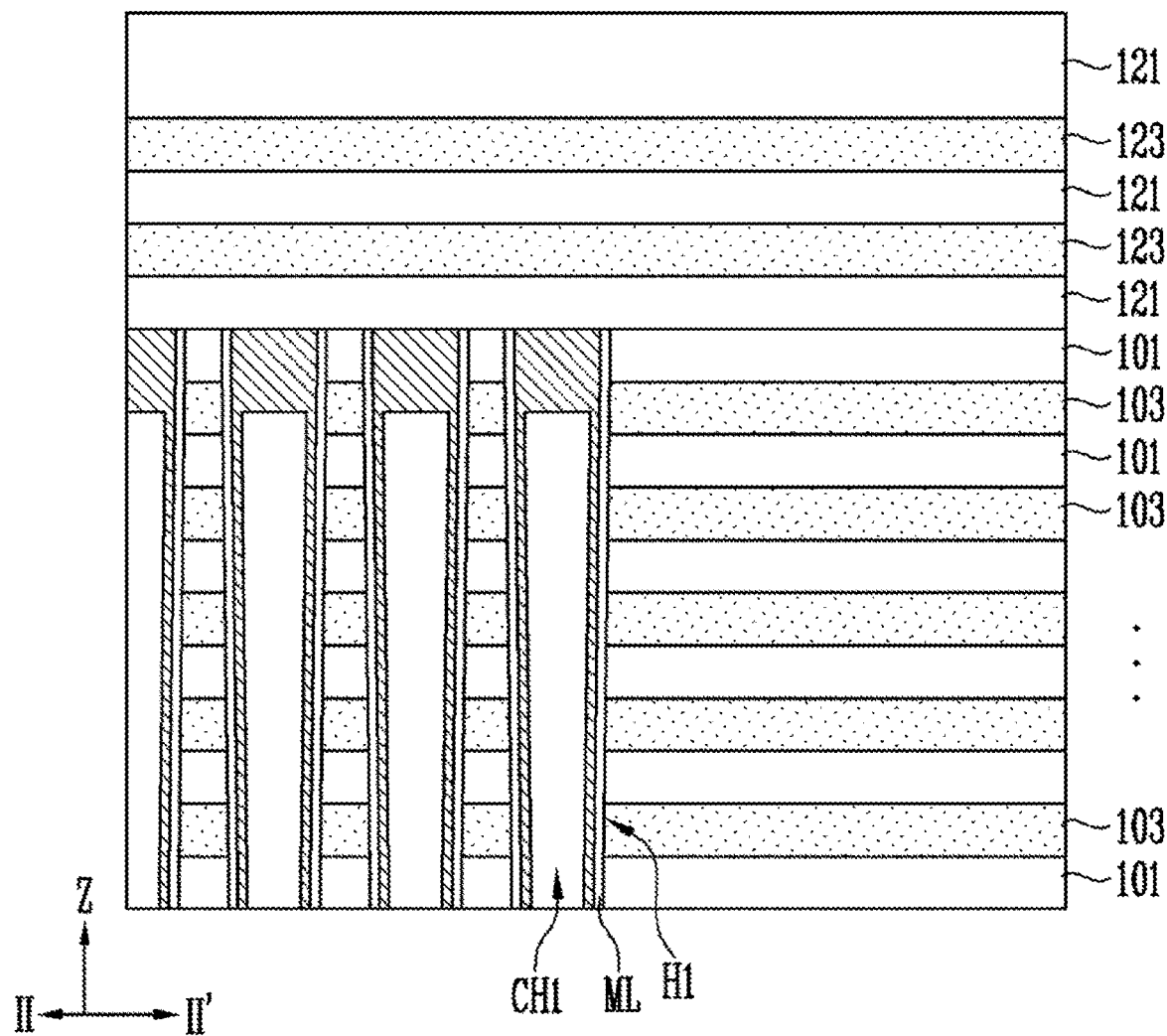

SEMICONDUCTOR DEVICE AND MANUFACTURING METHOD OF THE SEMICONDUCTOR DEVICE

CROSS-REFERENCE TO RELATED APPLICATION

The present application claims priority under 35 U.S.C. § 119(a) to Korean patent application number 10-2018-0128499, filed on Oct. 25, 2018, the entire disclosure of which is incorporated herein by reference in its entirety.

BACKGROUND

1. Technical Field

Various embodiments generally relate to a semiconductor device and a manufacturing method of the semiconductor device, and more particularly, to a three-dimensional semiconductor memory device and a manufacturing method of the three-dimensional semiconductor memory device.

2. Related Art

A semiconductor device may include a memory cell array including a plurality of memory cells. The memory cell array may include memory cells arranged in various structures. The memory cells may be arranged in three dimensions on a substrate to improve the integration density of the semiconductor device.

When manufacturing the memory cells arranged in three dimensions, various technologies for lowering a level of difficulty of a manufacturing process are being developed.

SUMMARY

According to an embodiment, a method of manufacturing a semiconductor device may include forming a first stack structure penetrated by first channel structures, forming electrode patterns surrounding second channel structures and separated from each other by first slits and second slits, the second channel structures coupled to the first channel structures, and the second slits comprising a different width from the first slits, filling each of the first slits and the second slits with an insulating material to cover sidewalls of the electrode patterns, and forming third slits passing through the insulating material in each of the second slits and extending to pass through the first stack structure.

According to an embodiment, a semiconductor device may include a first gate stack structure including first interlayer insulating layers and first electrode patterns that are alternately stacked on each other, at least one separation insulating layer disposed on the first gate stack structure, and second gate stack structures separated from each other by the separation insulating layer and each including a second interlayer insulating layer and a second electrode pattern that are alternately stacked on each other. The second electrode pattern may include a conductive layer and a liner layer surrounding the conductive layer. The liner layer comprise a cross-sectional structure that is opened towards the separation insulating layer.

BRIEF DESCRIPTION OF THE DRAWINGS

FIGS. 3A and 3B are plan views illustrating a layout of a semiconductor device according to an embodiment;

FIGS. 8A and 8B are cross-sectional diagrams illustrating a forming method of a first stack structure and a second stack structure according to an embodiment;

DETAILED DESCRIPTION

The technical spirit of the present disclosure may include examples of embodiments to which various modifications and changes may be applied and which include various forms. Hereinafter, embodiments of the present disclosure will be described in order for those skilled in the art to which the present disclosure pertains to be able to readily implement the technical spirit of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as " . . . between," "immediately . . . between" or "adjacent to . . . " and "directly adjacent to . . . " may be construed similarly.

The terms used in the present application are merely used to describe particular embodiments, and are not intended to limit the present disclosure. Singular forms in the present disclosure are intended to include plural forms as well, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

Various embodiments may be directed to a semiconductor device capable of lowering a level of difficulty of a manufacturing process of a semiconductor device and a manufacturing method of the semiconductor device.

Figure 1A:
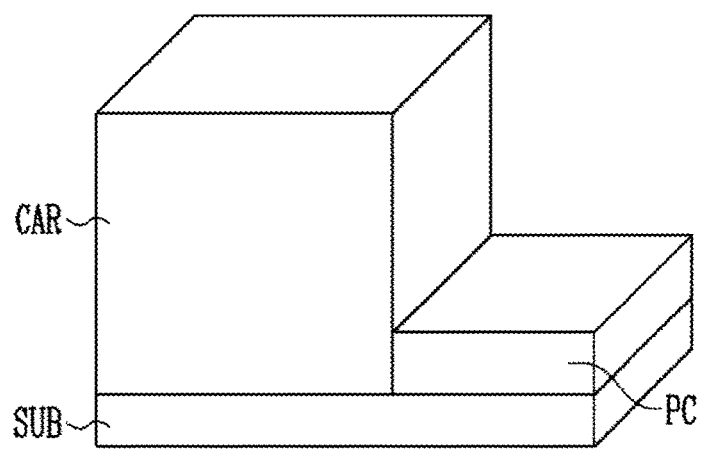
FIGS. 1A and 1B are block diagrams schematically illustrating semiconductor devices according to embodiments.
Figure 1B:
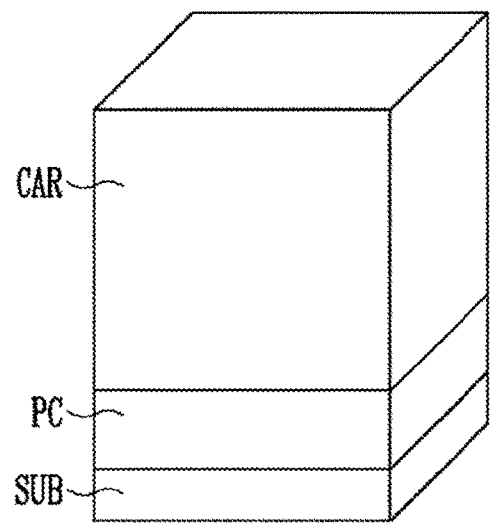

FIGS. 1A and 1B are block diagrams schematically illustrating semiconductor devices according to embodiments.

Referring to FIGS. 1A and 1B, each of the semiconductor devices according to embodiments may include a peripheral circuit structure PC and a cell array CAR which are arranged on a substrate SUB.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method.

The cell array CAR may include a plurality of memory blocks. Each of the memory blocks may include a plurality of cell strings. Each of the cell strings may be electrically coupled to a bit line, a source line, word lines and select lines. Each of the cell strings may include memory cells and select transistors which are coupled in series with each other. Each of the select lines may serve as a gate electrode of a corresponding one of the select transistors. Each of the word lines may serve as a gate electrode of a corresponding one of the memory cells.

The peripheral circuit structure PC may include NMOS and PMOS transistors, a resistor, and a capacitor which are electrically coupled to the cell array CAR. The NMOS and PMOS transistors, the resistor, and the capacitor may serve as elements forming a row decoder, a column decoder, a page buffer and a control circuit.

As shown in FIG. 1A, the peripheral circuit structure PC may be arranged on a region of the substrate SUB which does not overlap the cell array CAR.

Alternatively, as shown in FIG. 1B, the peripheral circuit structure PC may be arranged between the cell array CAR and the substrate SUB. Because the peripheral circuit structure PC overlaps the cell array CAR, an area of the substrate SUB which is occupied by the cell array CAR and the peripheral circuit structure PC may be reduced.

Figure 2:
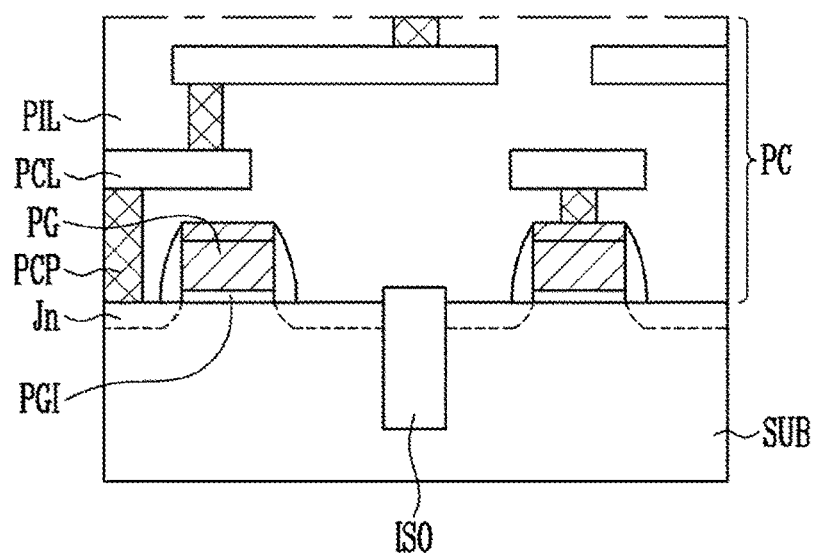
FIG. 2 is a cross-sectional diagram schematically illustrating a peripheral circuit structure.

FIG. 2 is a cross-sectional diagram schematically illustrating the peripheral circuit structure PC. The peripheral circuit structure PC as shown in FIG. 2 may be included in the peripheral circuit structure PC as shown in FIG. 1A, or the peripheral circuit structure PC as shown in FIG. 1B.

Referring to FIG. 2, the peripheral circuit structure PC may include peripheral gate electrodes PG, a peripheral gate insulating layer PGI, junctions Jn, peripheral circuit lines PCL, peripheral contact plugs PCP and a peripheral circuit insulating layer PIL.

Each of the peripheral gate electrodes PG may serve as a gate electrode of an NMOS transistor or a PMOS transistor of the peripheral circuit structure PC. The peripheral gate insulating layer PGI may be arranged between each of the peripheral gate electrodes PG and the substrate SUB.

The junctions Jn may be defined by injecting n-type or p-type impurities into an active region of the substrate SUB, may be located at both sides of each of the peripheral gate electrodes PG and may serve as a source junction or a drain junction. The active region of the substrate SUB may be divided by an isolation layer ISO formed in the substrate SUB. The isolation layer ISO may include an insulating material.

The peripheral circuit lines PCL may be electrically coupled to the peripheral contact plugs PCP.

The peripheral circuit insulating layer PIL may cover the peripheral circuit lines PCL and the peripheral contact plugs PCP. The peripheral circuit insulating layer PIL may include insulating layers which are stacked in multiple layers.

FIGS. 3A and 3B are plan views illustrating a layout of a semiconductor device according to an embodiment. Structures illustrated in FIGS. 3A and 3B, respectively, may be included in the cell array CAR as shown in FIG. 1A or 1B.

Referring to FIGS. 3A and 3B, a semiconductor device according to an embodiment may include a plurality of memory blocks BLK. Each of the memory blocks BLK may include first electrode patterns EP1 and second electrode patterns EP2. FIG. 3A illustrates a layout of the second electrode patterns EP2. FIG. 3B illustrates a layout of the first electrode patterns EP1. The second electrode patterns EP2 shown in FIG. 3A may be disposed above the first electrode patterns EP1 shown in FIG. 3B.

Each of the first electrode patterns EP1 and the second electrode patterns EP2 may include a cell region CA and a contact region CTA. Each of the first electrode patterns EP1 and the second electrode patterns EP2 may extend in a first horizontal direction X and a second horizontal direction Y that cross each other. The contact region CTA may extend from the cell region CA in the second horizontal direction Y. The contact region CTA of each of the first electrode patterns EP1 may be coupled to a corresponding first contact plug CT1. The contact region CTA of each of the second electrode patterns EP2 may be coupled to a corresponding second contact plug CT2. The first electrode patterns EP1 and the second electrode patterns EP2 may be stacked on each other in a first direction Z which crosses the first horizontal direction X and the second horizontal direction Y.

The first electrode patterns EP1 may surround first channel structures CH1 and the second electrode patterns EP2 may surround second channel structures CH2. The second channel structures CH2 may be coupled to the first channel structures CH1, respectively. In an embodiment, the second channel structures CH2 may be coupled to the first channel structures CH1 in a one-to-one manner whereby a single second channel structure CH2 is connected to a single first channel structure CH1. The number of second channel structures CH2 which are shared by each of the second electrode patterns EP2 may be less than the number of first channel structures CH1 which are shared by each of the first electrode patterns EP1. The first channel structures CH1 may pass through the cell region CA of each of the first electrode patterns EP1. The second channel structures CH2 may pass through the cell region CA of each of the second electrode patterns EP2.

Referring to FIG. 3A, the second electrode patterns EP2 according to an embodiment may be stacked above the first electrode patterns EP1 to expose the contact region CTA of each of the first electrode patterns EP1. The first electrode patterns EP1 may extend farther in the second horizontal direction Y than the second electrode patterns EP2.

The second electrode patterns EP2 may be arranged to be spaced apart from each other in the first horizontal direction X. The second electrode patterns EP2 neighboring each other may be separated from each other by one of first slits S1 or one of second slits S2. The first slits S1 and the second slits S2 may extend in the second horizontal direction Y.

The second slits S2 may be defined as patterns dividing boundaries between the memory blocks BLK. At least one first slit S1 may be disposed between the second slits S2 neighboring each other in the first horizontal direction X. In other words, a single first slit S1 or two or more first slits S1 may be disposed between the second slits S2 neighboring each other in the first horizontal direction X. The second electrode patterns EP2 included in each of the memory blocks BLK may be separated from each other in the first horizontal direction X by at least one first slit S1.

Each of the first slits S1 may have a zigzag shape. However, the embodiments are not limited to the first slits S1 having a zigzag shape and may have other shapes. According to an embodiment, each of the first slits S1 may have a wave shape. According to an embodiment, each of the first slits S1 may have a linear shape extending in the second horizontal direction Y.

A first width W1 of each of the first slits S1 may be different from a second width W2 of each of the second slits S2. For example, the first width W1 is smaller than the second width W2. Each of the first width W1 and the second width W2 may be defined by a value which is measured on a horizontal plane extending in the first horizontal direction X and the second horizontal direction Y and which is measured in a transverse direction, not in a longitudinal direction.

Each of the second electrode patterns EP2 may surround at least one column of second channel structures CH2. Each of the second electrode patterns EP2 may surround the second channel structures CH2 which are disposed in a plurality of columns and a plurality of rows. One or more columns of second channel structures CH2 may be disposed between the first slit S1 and the second slit S2 neighboring each other. When the first slits S1 are disposed to neighbor each other, one or more columns of second channel structures CH2 may be disposed between the first slits S1 neighboring each other.

The second channel structures CH2 may be disposed in a zigzag format. However, the embodiments are not limited to the second channel structures CH2 being disposed in a zigzag format. According to an embodiment, the second channel structures CH2 may be arranged parallel or substantially parallel with each other in the first horizontal direction X and the second horizontal direction Y. A gate insulating layer GI may be disposed between each of the second channel structures CH2 and each of the second electrode patterns EP2.

The second electrode patterns EP2 may be arranged to be spaced apart from each other on the same horizontal plane in the first horizontal direction X. The second electrode patterns EP2 may be disposed on two or more horizontal layers spaced apart from each other in the first direction Z. When the second electrode patterns EP2 are disposed on two or more horizontal layers, the second electrode patterns EP2 may be stacked in the first direction Z to expose the contact region CTA of each of the second electrode patterns EP2. The closer the second electrode patterns EP2 to the first electrode patterns EP1, the longer the second electrode patterns EP2 may extend in the second horizontal direction Y.

Referring to FIG. 3B, the first electrode patterns EP1 according to an embodiment may be separated from each other in the first horizontal direction X by third slits S3. The first electrode patterns EP1 included in each of the memory blocks BLK may be stacked to be spaced apart from each other in the first direction Z. The first electrode patterns EP1 may be stacked in the first direction Z to expose the contact region CTA of each of the first electrode patterns EP1. The farther the first electrode patterns EP1 from the second electrode patterns EP2 shown in FIG. 3A, the longer the first electrode patterns EP1 may extend in the second horizontal direction Y.

The third slits S3 may be disposed at boundaries between the memory blocks BLK. Each of the third slits S3 may extend in the second horizontal direction Y. The second slits S2 shown in FIG. 3A may overlap the third slits S3. A third width W3 of each of the third slits S3 may be less than the second width W2 shown in FIG. 3A. The third width W3 may be defined by a value which is measured on a horizontal plane extending in the first horizontal direction X and the second horizontal direction Y and which is measured in a transverse direction, not in a longitudinal direction.

Each of the first electrode patterns EP1 may be penetrated by the first channel structures CH1. The first channel structures CH1 may be disposed in a plurality of columns and a plurality of rows. The first channel structures CH1 may be disposed in a zigzag format. However, the embodiments are not limited to the first channel structures CH1 being disposed in the zigzag format. According to an embodiment, the first channel structures CH1 may be arranged parallel or substantially parallel with each other in the first horizontal direction X and the second horizontal direction Y. A multilayer ML may be disposed between each of the first channel structures CH1 and each of the first electrode patterns EP1.

At least one slit S1 may overlap each of the first electrode patterns EP1 above the first electrode patterns EP1. At least two second electrode patterns EP2 of FIG. 3A which are separated from each other on the same horizontal plane by at least one first slit S1 may overlap each of the first electrode patterns EP1 above the first electrode patterns EP1.

Figure 4A:
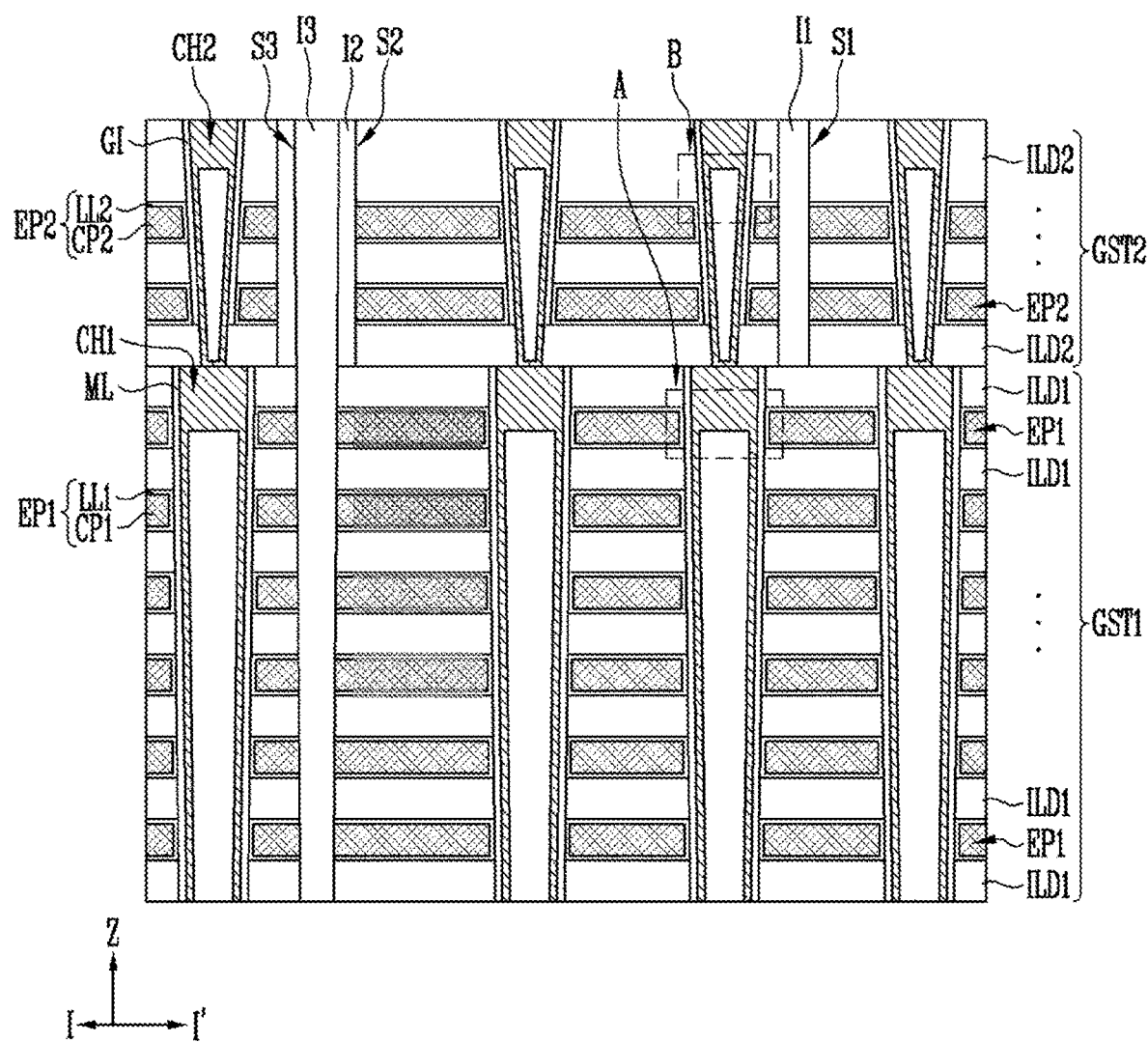
FIGS. 4A and 4B are cross-sectional diagrams illustrating a semiconductor device according to an embodiment.
Figure 4B:
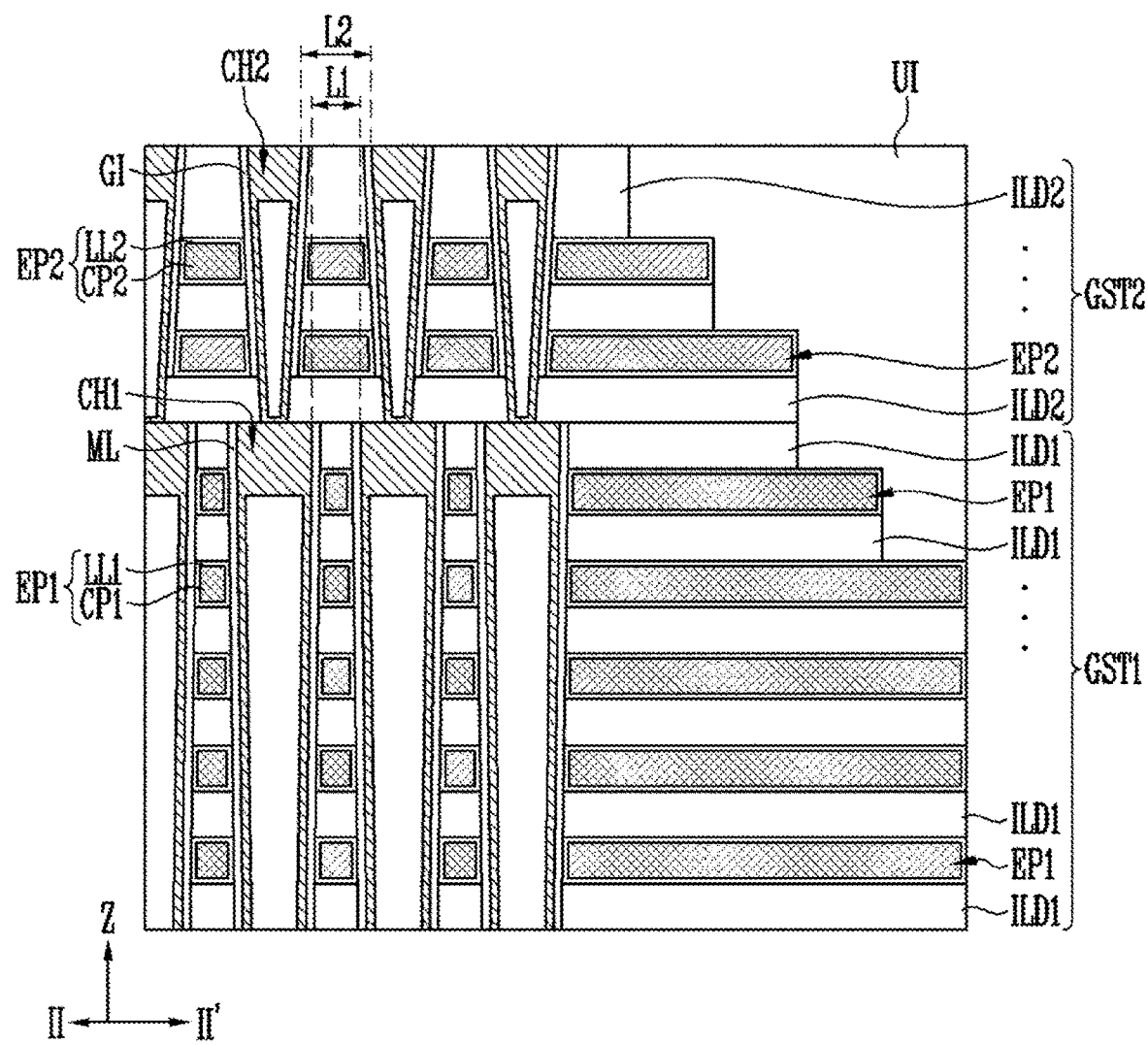

FIGS. 4A and 4B are cross-sectional diagrams illustrating a semiconductor device according to an embodiment. For example, FIGS. 4A and 4B illustrate cross sections of the memory block including the second electrode patterns EP2 shown in FIG. 3A and the first electrode patterns EP1 shown in FIG. 3B. FIG. 4A illustrates a cross section of the memory block which is taken along line I-I' of each of FIGS. 3A and 3B. FIG. 4B illustrates a cross section of the memory block which is taken along line II-II' shown in each of FIGS. 3A and 3B. The structure shown in each of FIGS. 4A and 4B may be included in the cell array CAR shown in FIG. 1A or FIG. 1B.

Referring to FIGS. 4A and 4B, the first electrode patterns EP1 may be included in first gate stack structures GST1 and the second electrode patterns EP2 may be included in second gate stack structures GST2. The second gate stack structures GST2 may be separated from each other by the first slit S1 or the second slit S2, and the first gate stack structures GST1 may be separated from each other by the third slit S3.

The first slit S1 may be filled with a separation insulating layer I1. The third slit S3 may be filled with a vertical structure I3. According to an embodiment, the vertical structure I3 may include an insulating material. According to an embodiment, the vertical structure I3 may include a vertical conductive pattern and an insulating layer extending along a sidewall of the vertical conductive pattern. The third slit S3 and the vertical structure I3 may extend to pass through a slit insulating layer I2 disposed in the second slit S2.

Each of the first gate stack structures GST1 separated from each other by the third slit S3 and the vertical structure I3 may include first interlayer insulating layers ILD1 and the first electrode patterns EP1 which are alternately stacked on each other in the first direction Z. Each of the first electrode patterns EP1 may be disposed between the first interlayer insulating layers ILD1 neighboring each other in the first direction Z. Each of the first electrode patterns EP1 may include a first conductive layer CP1. Each of the first electrode patterns EP1 may further include the first conductive layer CP1 and a first liner layer LL1 which surrounds the first conductive layer CP1 and which has a cross-sectional structure opened towards the third slit S3 and the vertical structure I3. The first liner layer LL1 may include at least a barrier layer. The first liner layer LL1 may extend between the first conductive layer CP1 and the first interlayer insulating layer ILD1 adjacent to the first conductive layer CP1.

The first electrode patterns EP1 may be stacked in the first direction Z to form a stepped structure as shown in FIG. 4B. According to an embodiment, the first interlayer insulating layer ILD1 that is disposed above each of the first electrode patterns EP1 stacked in the stepped structure may expose the first electrode pattern EP1 which is disposed below the first interlayer insulating layer ILD1 as shown in FIG. 4B. Although not illustrated in FIG. 4B, according to an embodiment, the first interlayer insulating layer ILD1 that is disposed above each of the first electrode patterns EP1 may completely cover a top surface of the first electrode pattern EP1 which is disposed below the first interlayer insulating layer ILD1.

The first channel structures CH1 passing through the first gate stack structures GST1, respectively, may be surrounded with the first interlayer insulating layers ILD1 and the first electrode patterns EP1. The multilayers ML may be disposed between the first channel structures CH1 and the first electrode patterns EP1. Each of the multilayers ML may extend along an outer wall of the corresponding first channel structure CH1. However, the embodiments are not limited to each of the multilayers ML extending along the outer wall of the corresponding first channel structure CH1. Although not illustrated in FIGS. 4A and 4B, according to an embodiment, the multilayers ML may extend along interfaces between the first electrode patterns EP1 and the first interlayer insulating layers ILD1, and interfaces between the first channel structures CH1 and the first electrode patterns EP1. The first liner layer LL1 may extend between each of the multilayers ML and the first conductive layer CP1 corresponding to each of the multilayers ML.

Each of the second gate stack structures GST2 separated from each other by the first slit S1 or the second slit S2 may include a second interlayer insulating layer ILD2 and the second electrode pattern EP2 which are alternately stacked on each other in the first direction Z. According to an embodiment, each of the second gate stack structures GST2 may have a double layer including the second interlayer insulating layer ILD2 and the second electrode pattern EP2 which are sequentially stacked above the first gate stack structure GST1. According to an embodiment, each of the second gate stack structures GST2 may have a triple layer or a multiple layer including the second interlayer insulating layers ILD2 and the second electrode patterns EP2 which are alternately stacked on each other in the first direction Z.

Each of the second electrode patterns EP2 may include a second conductive layer CP2. Each of the second electrode patterns EP2 may further include a second liner layer LL2 which surrounds the second conductive layer CP2. The second liner layer LL2 has a cross-sectional structure opened towards the third slit S3 and the vertical structure I3. The second liner layer LL2 has a cross-sectional structure opened towards the first slit S1 and the separation insulating layer I1. The second liner layer LL2 may include at least a barrier layer. The second liner layer LL2 may extend between the second conductive layer CP2 and the second interlayer insulating layer ILD2 adjacent to the second conductive layer CP2.

When each of the second gate stack structures GST2 includes two or more layers of second electrode patterns EP2 stacked in the first direction Z, the second electrode patterns EP2 may be stacked in the first direction Z to form a stepped structure as shown in FIG. 4B. According to an embodiment, the second interlayer insulating layer ILD2 that is disposed above each of the second electrode patterns EP2 formed in the stepped structure may expose the second electrode pattern EP2 which is disposed below the second interlayer insulating layer ILD2 as shown in FIG. 4B. Although not illustrated in FIG. 4B, according to an embodiment, the second interlayer insulating layer ILD2 that is disposed above each of the second electrode patterns EP2 formed in the stepped structure may extend to completely cover a top surface of the second electrode pattern EP2 which is disposed below the second interlayer insulating layer ILD2.

The second channel structures CH2 passing through each of the second gate stack structures GST2 may be surrounded with the corresponding second interlayer insulating layer ILD2 and the corresponding second electrode pattern EP2. The gate insulating layer GI may be disposed between each of the second channel structures CH2 and the second electrode pattern EP2 corresponding to the second channel structure CH2. The gate insulating layer GI may extend along an outer wall of the corresponding second channel structure CH2. The second liner layer LL2 may extend between the gate insulating layer GI and the second conductive layer CP2 which correspond to the second liner layer LL2.

Each of the first conductive layer CP1 and the second conductive layer CP2 may include at least one of a silicon layer, a metal silicide layer, a metal layer, and a metal nitride layer. Each of the first conductive layer CP1 and the second conductive layer CP2 may include metal such as tungsten for low resistance wiring.

Each of the first interlayer insulating layers ILD1 and the second interlayer insulating layers ILD2 may include various insulating materials. For example, each of the first interlayer insulating layers ILD1 and the second interlayer insulating layers ILD2 may include a silicon oxide layer.

The stepped structure of each of the first gate stack structures GST1 and the second gate stack structures GST2 may be covered by an upper insulating layer UI as shown in FIG. 4B. A surface of the upper insulating layer UI may be flat. The upper insulating layer UI may be a single layer or include multiple layers. According to an embodiment, the upper insulating layer UI may include an oxide layer. According to an embodiment, the upper insulating layer UI may include a stacked structure of an oxide layer and an etch stop layer. A nitride layer may serve as an etch stop layer.

A thickness of each of the second gate stack structures GST2 in the first direction Z may be less than a thickness of each of the first gate stack structures GST1 in the first direction Z. A length of each of the second channel structures CH2 extending in the first direction Z may be less than a length of each of the first channel structures CH1 extending in the first direction Z.

The minimum distance between the first channel structures CH1 disposed in each first gate stack structure GST1 may be defined as a first distance L1 as shown in FIG. 4B. The minimum distance between the second channel structures CH2 coupled to the first channel structures CH1 arranged at the first distance L1, respectively, may be defined as a second distance L2 as shown in FIG. 4B. Each of the first channel structures CH1 longer than each of the second channel structures CH2 may have an upper end having a greater width than an upper end of each of the second channel structures CH2. Accordingly, the first distance L1 is smaller than the second distance L2.

According to an embodiment, the separation insulating layer I1 and the first slit S1 may be disposed between the second channel structures CH2 arranged at the distance which is relatively great and might not extend between the first channel structures CH1. Thereby, according to an embodiment, because a space to which the separation insulating layer I1 and the first slit S1 are disposed is sufficiently secured even when the distance between the first channel structures CH1 is not extended, a size of a memory block may be decreased.

According to an embodiment, because the second channel structures CH2 are relatively narrow to the first channel structures CH1, a space to which the separation insulating layer I1 and the first slit S1 are disposed may be sufficiently secured between the second channel structures CH2.

The second channel structures CH2 neighboring each other with each third slit S3 interposed therebetween and the first channel structures CH1 neighboring each other with each third slit S3 interposed therebetween may be spaced apart from each other at a distance greater than the first distance L1. Accordingly, even when the third slit S3 may be longer than the first slit S1, a space to which the third slit S3 is disposed may be sufficiently secured at a boundary of the memory blocks.

Figure 5A:
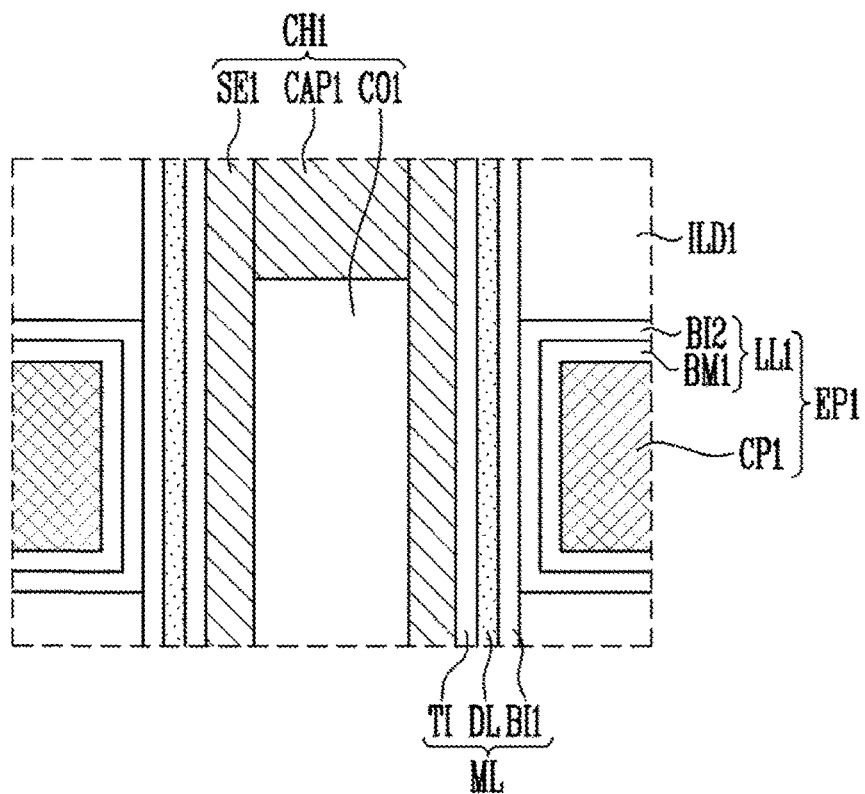
FIGS. 5A and 5B are enlarged cross-sectional diagrams illustrating some regions of a semiconductor device according to an embodiment.
Figure 5B:
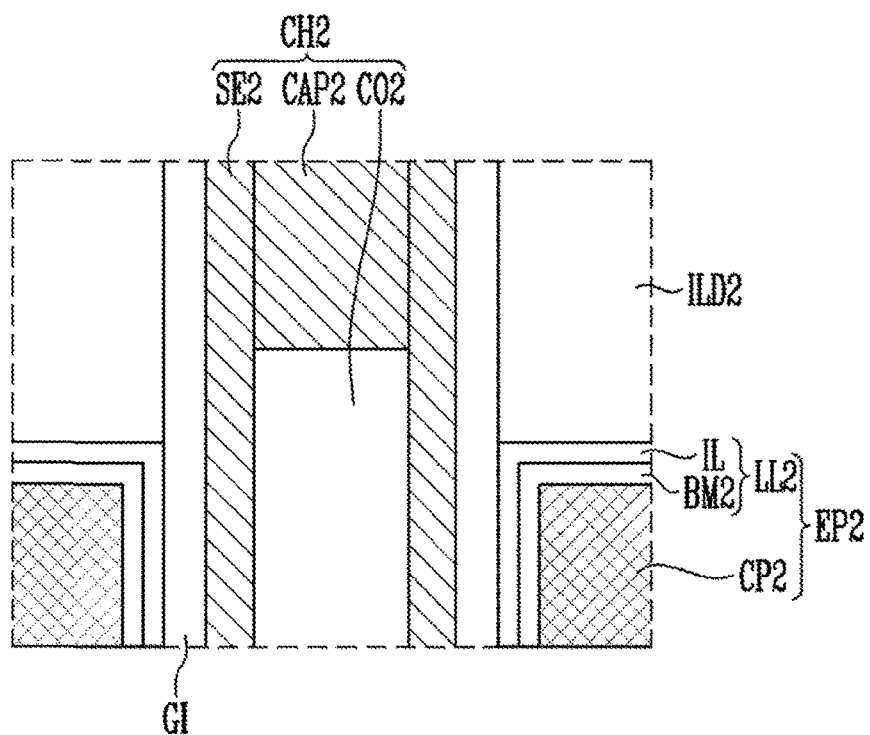

FIGS. 5A and 5B are enlarged cross-sectional diagrams illustrating some regions of a semiconductor device according to an embodiment. FIG. 5A is an enlarged diagram of region A shown in FIG. 4A. FIG. 5B is an enlarged diagram of region B shown in FIG. 4A.

Referring to FIG. 5A, each first channel structure CH1 may include a first semiconductor layer SE1. According to an embodiment, the first semiconductor layer SE1 may include a silicon layer. The first semiconductor layer SE1 may be conformally formed on an inner wall of the multilayer ML, or may completely fill a central area of the multilayer ML.

As shown in FIG. 5A, when the first semiconductor layer SE1 is conformally formed on the inner wall of the multilayer ML, the first channel structure CH1 may further include a first core insulating layer CO1 and a first capping pattern CAP1 which fill a central area of the first semiconductor layer SE1. The first core insulating layer CO1 may have a less height than the first semiconductor layer SE1. The first capping pattern CAP1 may be surrounded with an upper end of the first semiconductor layer SE1 which protrudes farther than the first core insulating layer CO1, and may be disposed on the first core insulating layer CO1. The first capping pattern CAP1 may contact the first semiconductor layer SE1. The first capping pattern CAP1 may include a doped semiconductor layer doped with impurities. According to an embodiment, the first capping pattern CAP1 may include a doped silicon layer including an n-type impurity.

The multilayer ML may extend along a sidewall of the first channel structure CH1. The multilayer ML may include a tunnel insulating layer TI surrounding the first channel structure CH1, a data storage layer DL surrounding the tunnel insulating layer TI, and a first blocking insulating layer BI1 surrounding the data storage layer DL.

The data storage layer DL may include a charge trapping layer, a material layer including conductive nanodots, or a phase-change material layer.

The data storage layer DL may store data changed by using Fowler-Nordheim tunneling induced by the voltage difference between a pattern which serves as a word line among the first electrode patterns EP1 and the first channel structure CH1 which are described with reference to FIGS. 4A and 4B. The data storage layer DL may include a silicon nitride layer enabling charge trapping.

The data storage layer DL may store data on the basis of another operating principle in addition to Fowler-Nordheim tunneling. For example, the data storage layer DL may include a phase-change material layer and store data according to a phase change.

The first blocking insulating layer BI1 may include an oxide layer capable of blocking charges. The tunnel insulating layer TI may include a silicon oxide layer enabling charge tunneling.

The first liner layer LL1 may include a first barrier layer BM1. The first liner layer LL1 may further include a second blocking insulating layer BI2.

The first barrier layer BM1 may prevent direct contact between the first conductive layer CP1 and the first interlayer insulating layer ILD1, or direct contact between the first conductive layer CP1 and the second blocking insulating layer BI2. The first barrier layer BM1 may block diffusion of metal included in the first conductive layer CP1. The first barrier layer BM1 may include a metal nitride layer. For example, the first barrier layer BM1 may include a titanium nitride layer, a tungsten nitride layer, or a tantalum nitride layer.

The second blocking insulating layer BI2 may include an insulating material having a high dielectric constant. For example, the second blocking insulating layer BI2 may include a metal oxide such as an aluminum oxide layer. One of the first blocking insulating layer BI1 and the second blocking insulating layer BI2 may be omitted.

Referring to FIG. 5B, each of the second channel structures CH2 may include a second semiconductor layer SE2.

According to an embodiment, the second semiconductor layer SE2 may include a silicon layer. The second semiconductor layer SE2 may be conformally formed on an inner wall of the gate insulating layer GI, or may completely fill a central area of the gate insulating layer GI.

As shown in FIG. 5B, when the second semiconductor layer SE2 is conformally formed on the inner wall of the gate insulating layer GI, the second channel structure CH2 may further include a second core insulating layer CO2 and a second capping pattern CAP2 which fill a central area of the second semiconductor layer SE2. The second semiconductor layer SE2 may extend along a sidewall and a bottom surface of the second core insulating layer CO2 and contact the first channel structure CH1 as shown in FIGS. 4A and 4B. The second core insulating layer CO2 may have a less height than the second semiconductor layer SE2. The second capping pattern CAP2 may be surrounded with an upper end of the second semiconductor layer SE2 which protrudes farther than the second core insulating layer CO2, and may be disposed on the second core insulating layer CO2. The second capping pattern CAP2 may contact the second semiconductor layer SE2. The second capping pattern CAP2 may include a doped semiconductor layer doped with impurities.

According to an embodiment, the second capping pattern CAP2 may include a doped silicon layer including an n-type impurity.

The gate insulating layer GI may be disposed between the second channel structure CH2 and the second electrode pattern EP2. The gate insulating layer GI may extend along the sidewall of the second channel structure CH2. The gate insulating layer GI may include a silicon oxide layer.

The second liner layer LL2 may include a second barrier layer BM2. The second liner layer LL2 may further include an insulating thin film IL.

The second barrier layer BM2 may prevent direct contact between the second conductive layer CP2 and the second interlayer insulating layer ILD2, or may prevent direct contact between the second conductive layer CP2 and the insulating thin film IL. In an embodiment, the second barrier layer BM2 may mitigate diffusion of metal included in the second conductive layer CP2. The second barrier layer BM2 may include a metal nitride layer. For example, the second barrier layer BM2 may include a titanium nitride layer, a tungsten nitride layer, or a tantalum nitride layer.

The insulating thin film IL may include an insulating material having a high dielectric constant. For example, the insulating thin film IL may include a metal oxide such as an aluminum oxide layer.

Figure 6A:
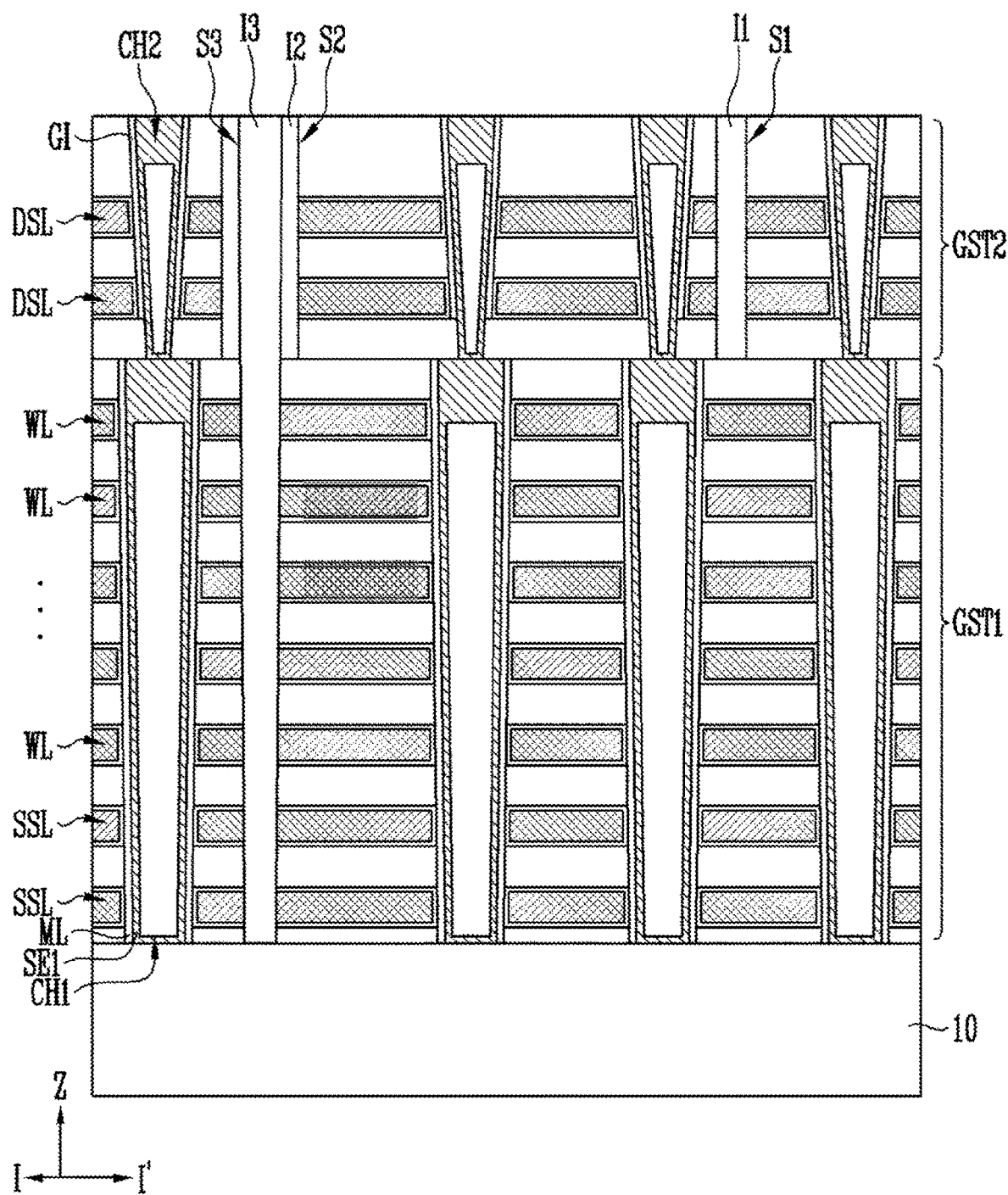
FIGS. 6A to 6C are cross-sectional diagrams illustrating various embodiments of a lower structure disposed under a first gate stack structure.
Figure 6B:
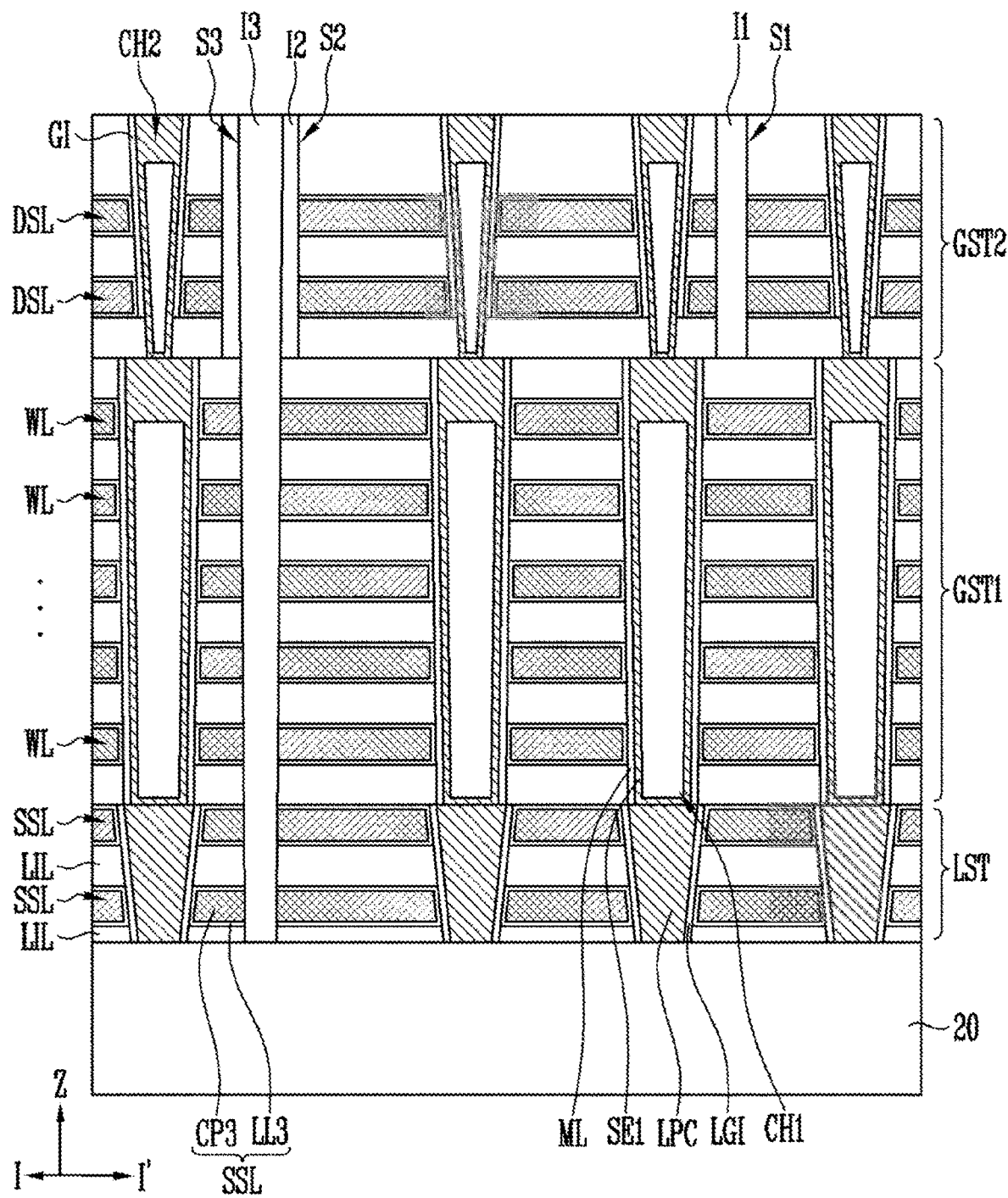
Figure 6C:
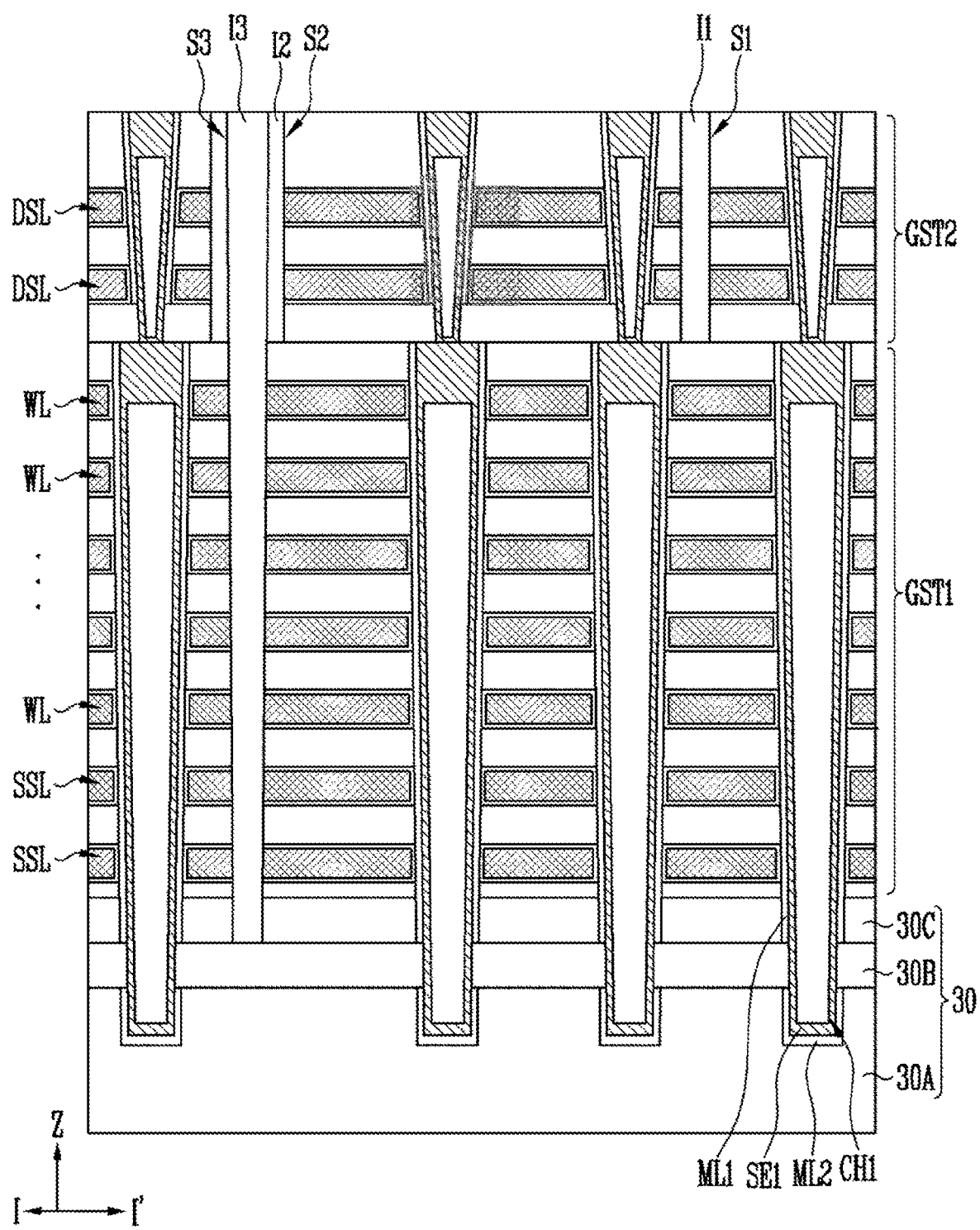

FIGS. 6A to 6C are cross-sectional diagrams illustrating various embodiments of a lower structure disposed under the first gate stack structure.

Referring to FIGS. 6A to 6C, a doped semiconductor layer 10, 20, or 30 may be disposed under the first gate stack structure GST1. The doped semiconductor layer 10, 20, or 30 may extend to be coupled to the vertical structure I3. The doped semiconductor layer 10, 20, or 30 may serve as a source region. The doped semiconductor layer 10, 20, or 30 which serves as a source region may include a source dopant. For example, a source dopant may include an n-type impurity. As shown in FIGS. 6A and 6B, the doped semiconductor layer 10 or 20 may be a single layer. As shown in FIG. 6C, the doped semiconductor layer 30 may include two or more layers 30A, 30B, and 30C which are sequentially stacked on each other.

According to an embodiment, the respective doped semiconductor layers 10, 20, and 30A which are shown in FIGS. 6A, 6B, and 6C, respectively, may be formed by injecting an impurity into a surface of the substrate SUB shown in FIG. 1A, or by depositing at least one doped silicon layer. According to an embodiment, the respective doped semiconductor layers 10, 20, and 30A to 30C which are shown in FIGS. 6A, 6B, and 6C, respectively, may be formed by forming an insulating layer on the substrate SUB shown in FIG. 1B and depositing at least one doped silicon layer on the insulating layer.

Referring to FIGS. 6A and 6C, the first electrode patterns of the first gate stack structure GST1 may serve as word lines WL or at least one source select lines SSL. The lowermost pattern adjacent to the doped semiconductor layer 10 or 30 among the first electrode patterns may serve as the source select line SSL. However, the embodiments are not limited thereto, and one or more first electrode patterns successively disposed on the lowermost pattern may serve as the source select lines SSL. The first electrode patterns disposed above at least one source select line SSL may serve as the word lines WL.

Referring to FIG. 6B, the first electrode patterns of the first gate stack structure GST1 may serve as the word lines WL. A lower stack structure LST may be further formed between the first gate stack structure GST1 and the doped semiconductor layer 20. The lower stack structure LST may include at least one lower interlayer insulating layer LIL and at least one source select line SSL stacked alternately with each other.

Referring to FIGS. 6A to 6C, the first semiconductor layer SE1 of each of the first channel structures CH1 may be coupled to the doped semiconductor layer 10, 20, or 30.

According to an embodiment, a bottom surface of the first semiconductor layer SE1 may directly contact the doped semiconductor layer 10 as shown in FIG. 6A. The multilayer ML surrounding each of the first channel structures CH1 may be penetrated by the first semiconductor layer SE1.

According to an embodiment, the bottom surface of the first semiconductor layer SE1 may be coupled to a lower channel structure LPC passing through the lower stack structure LST as shown in FIG. 6B. The multilayer ML surrounding each of the first channel structures CH1 may be penetrated by the first semiconductor layer SE1.

An outer wall of the lower channel structure LPC may be surrounded by a lower gate insulating layer LGI. The doped semiconductor layer 20 may contact the bottom surface of the lower channel structure LPC. The first semiconductor layer SE1 may be coupled to the doped semiconductor layer 20 via the lower channel structure LPC. The lower channel structure LPC may be formed by growing a semiconductor material by a selective epitaxial growth method, or by depositing a semiconductor material. The lower channel structure LPC may include n-type impurities. The lower channel structure LPC may be doped with impurities by an in-situ method or an ion injection method.

The source select line SSL shown in FIG. 6B may include a third conductive layer CP3 surrounding the lower channel structure LPC. The source select line SSL may further include a third liner layer LL3 which surrounds the third conductive layer CP3 and which has a cross-sectional structure opened towards the third slit S3 and the vertical structure I3. The third liner layer LL3 may include at least a barrier layer. The third liner layer LL3 may extend between the third conductive layer CP3 and the lower interlayer insulating layer LIL adjacent to the third conductive layer CP3, and between the third conductive layer CP3 and the lower channel structure LPC adjacent to the third conductive layer CP3. The third liner layer LL3 may include a barrier layer the same as the second liner layer LL2 shown in FIG. 5B. The third liner layer LL3 may further include an insulating thin film the same as the second liner layer LL2 shown in FIG. 5B.

According to an embodiment, the first channel structures CH1 may extend into the doped semiconductor layer 30 as shown in FIG. 6C. The doped semiconductor layer 30 may include first, second and third layers 30A, 30B, and 30C stacked sequentially on top of each other. Each of the first, second, and third layers 30A, 30B, and 30C may include a doped semiconductor layer. According to an embodiment, each of the first, second, and third layers 30A, 30B, and 30C may include a doped silicon layer.

The first channel structures CH1 may extend into the first layer 30A. The first semiconductor layer SE1 of each of the first channel structures CH1 may directly contact the second layer 30B. The second layer 30B may protrude towards the sidewall of the first semiconductor layer SE1 and separate the multilayer into a first multilayer pattern ML1 and a second multilayer pattern ML2. The third layer 30C may be omitted in some cases.

According to the structures described above with reference to FIGS. 6A to 6C, memory cells may be formed at intersections of the first channel structures CH1 and the word lines WL, and a source select transistor may be formed at an intersection of each of the first channel structures CH1 and each of the source select lines SSL which are shown in FIGS. 6A and 6C, or at an intersection of the lower channel structure LPC and each of the source select lines SSL as shown in FIG. 6B.

The second electrode pattern of the second gate stack structure GST2 may be disposed above the word lines WL and serve as a drain select line DSL. A drain select transistor may be formed at each of intersections of the drain select lines DSL and the second channel structures CH2.

When a semiconductor device according to an embodiment is formed, a forming process of a first stack structure penetrated by first channel structures and a forming process of second electrode patterns which surround second channel structures may be separately performed from each other. Thereby, a level of difficulty of a manufacturing process of a semiconductor device may be decreased. Hereinafter, various embodiments of a manufacturing method of a semiconductor device will be described.

Figure 7A:
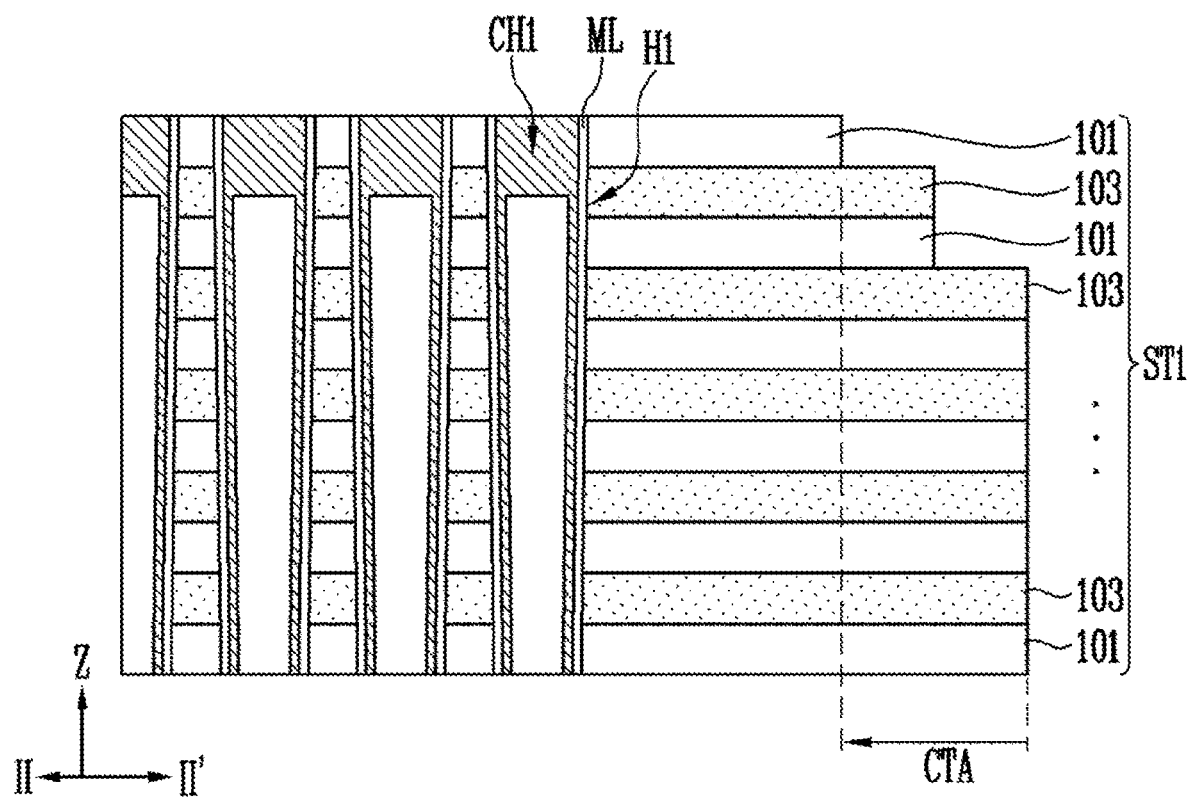
FIGS. 7A to 7C are cross-sectional diagrams illustrating a forming method of a first stack structure and a second stack structure according to an embodiment.
Figure 7B:
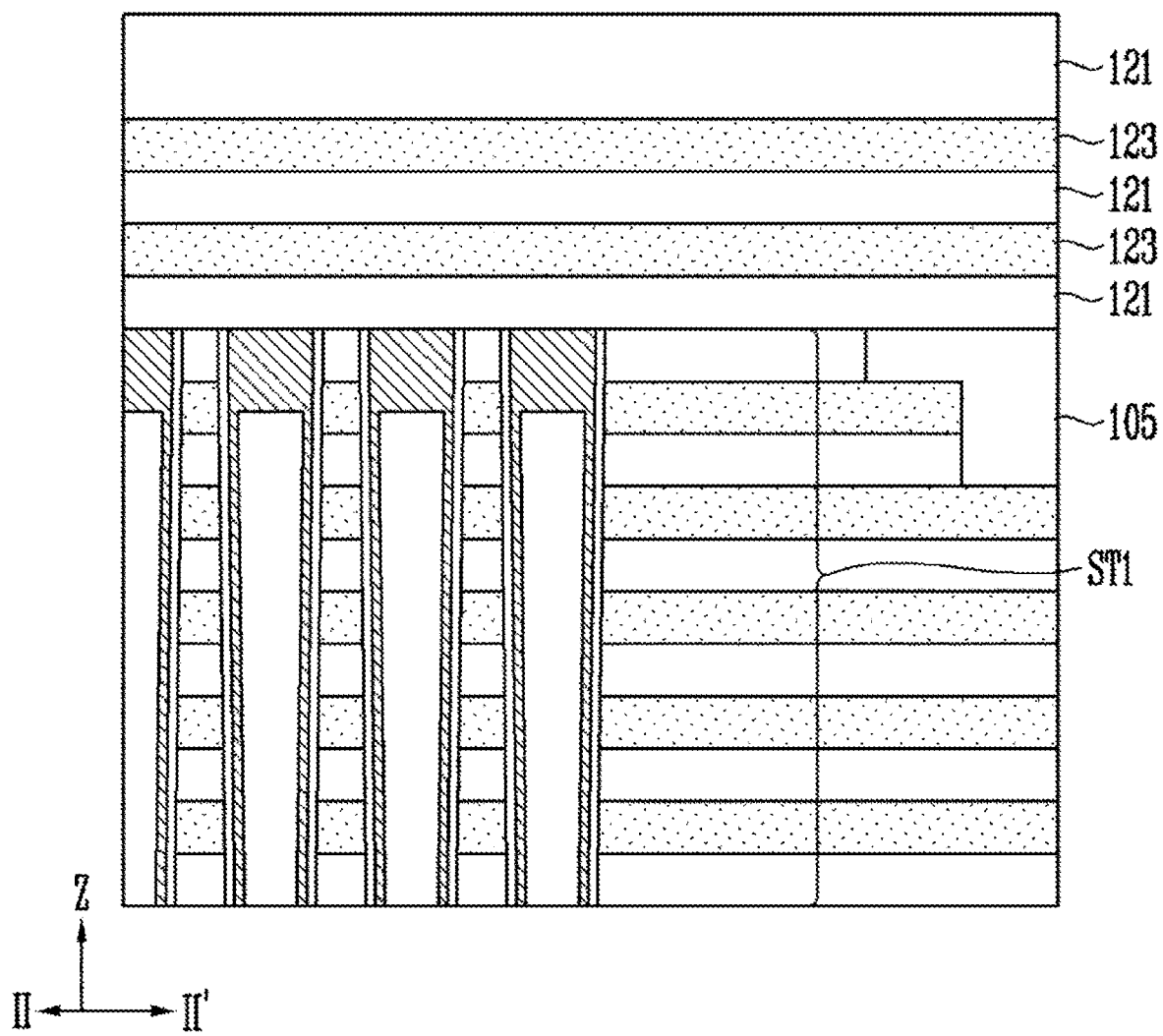
Figure 7C:
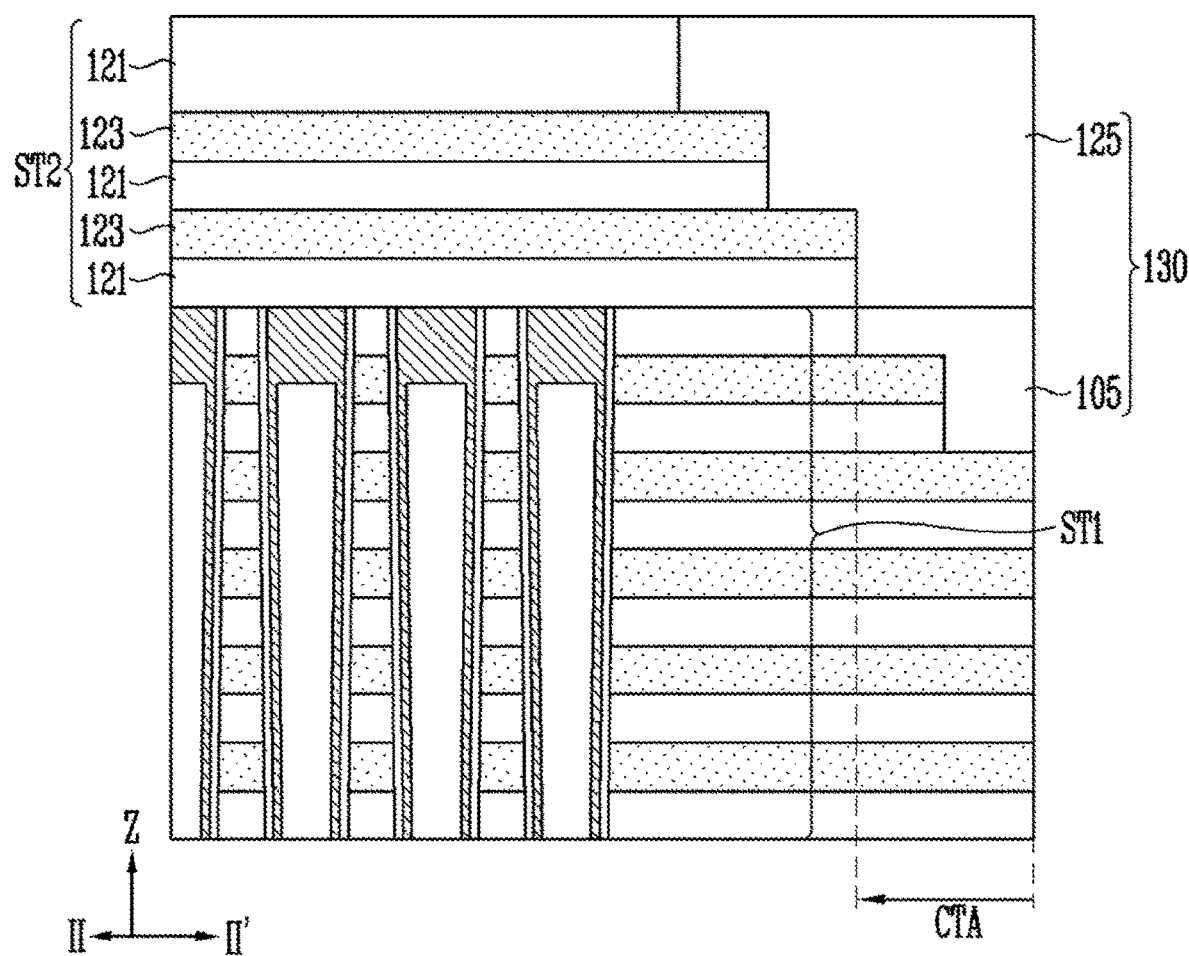

FIGS. 7A to 7C are cross-sectional diagrams illustrating a forming method of a first stack structure ST1 and a second stack structure ST2 according to an embodiment. FIGS. 7A to 7C are cross-sectional diagrams in accordance with steps of a process, which are taken along line II-II' shown in each of FIGS. 3A and 3B.

Referring to FIG. 7A, the first stack structure ST1 penetrated by the first channel structures CH1 may be first formed. The first stack structure ST1 may include the contact region CTA formed in the stepped structure.

First material layers 101 and second material layers 103 may be alternately stacked on each other in the first direction Z to form the first stack structure ST1 as described above. The first material layers 101 may include a different material from the second material layers 103.

According to an embodiment, the first material layers 101 may include an insulating material for a first interlayer insulating layer, and the second material layers 103 may include a sacrificial material having a different etch rate from the first material layers 101. For example, the first material layers 101 may include silicon oxide layers, and the second material layers 103 may include silicon nitride layers. According to this embodiment, the second material layers 103 may be replaced by electrode patterns and each of the first material layers 101 may remain as a first interlayer insulating layer during a subsequent process.

According to an embodiment, the first material layers 101 may include an insulating material for a first interlayer insulating layer, and the second material layers 103 may include a conductive material for first electrode patterns. The first material layers 101 may include silicon oxide layers and the second material layers 103 may include at least one of a doped silicon layer, a metal silicide layer, a metal layer and a metal nitride layer. According to an embodiment, each of the second material layers 103 may remain as a first electrode pattern and each of the first material layers 101 may remain as a first interlayer insulating layer during a subsequent process.

Subsequently, forming the first stack structure ST1 may include forming first holes H1 passing through the first material layers 101 and the second material layers 103, and filling the first holes H1 with the first channel structures CH1, respectively. Before forming the first channel structures CH1, forming the multilayer ML on a surface of each of the first holes H1 may be further included. The first channel structures CH1 may be formed on the multilayer ML. Each of the first channel structures CH1 and the multilayer ML may have the same structure as described above with reference to FIG. 5A.

After forming the first channel structures CH1 or before forming the first holes H1, forming a stepped structure by etching the first material layers 101 and the second material layers 103 may be performed.

Referring to FIG. 7B, a first gap-fill insulating layer 105 may be formed to cover the stepped structure of the first stack structure ST1. The first gap-fill insulating layer 105 may include an oxide layer. The surface of the first gap-fill insulating layer 105 may be planarized.

Subsequently, a third material layer 121 and a fourth material layer 123 may be alternately stacked on the first stack structure ST1. The third material layer 121 and the fourth material layer 123 may extend to cover the first gap-fill insulating layer 105.

According to an embodiment, a double layered structure including the third material layer 121 and the fourth material layer 123 may be formed above the first stack structure ST1. According to an embodiment, a triple layered structure or a multiple layered structure including the third material layers 121 and the fourth material layers 123 alternately stacked on each other may be formed above the first stack structure ST1. The third material layer 121 and the fourth material layer 123 may include different materials from each other.

According to an embodiment, the third material layer 121 may include an insulating material for a second interlayer insulating layer, and the fourth material layer 123 may include a sacrificial material having a different etch rate from the third material layer 121. For example, the third material layer 121 may include a silicon oxide layer, and the fourth material layer 123 may include a silicon nitride layer. According to these embodiments, the fourth material layer 123 may be replaced with an electrode pattern and the third material layer 121 may remain as a second interlayer insulating layer during a subsequent process.

According to an embodiment, the third material layer 121 may include an insulating material for a second interlayer insulating layer, and the fourth material layer 123 may include a conductive material for a second electrode pattern. The third material layer 121 may include a silicon oxide layer and the fourth material layer 123 may include at least one of a doped silicon layer, a metal silicide layer, a metal layer, and a metal nitride layer. According to an embodiment, the fourth material layer 123 may remain as a second electrode pattern and the third material layer 121 may remain as a second interlayer insulating layer during a subsequent process.

Referring to FIG. 7C, the second stack structure ST2 exposing the contact region CTA of the first stack structure ST1 may be formed by etching the third material layer 121 and the fourth material layer 123. When the second stack structure ST2 includes a triple layered structure or a multiple layered structure including the third material layers 121 and the fourth material layers 123, the third material layers 121 and the fourth material layers 123 may be etched to have a stepped structure.

Subsequently, a second gap-fill insulating layer 125 may be formed on the first gap-fill insulating layer 105. The second gap-fill insulating layer 125 may include an oxide layer. The second gap-fill insulating layer 125 may cover the stepped structure of the second stack structure ST2. A surface of the second gap-fill insulating layer 125 may be planarized. The first gap-fill insulating layer 105 and the second gap-fill insulating layer 125 may constitute an upper insulating layer 130 covering the stepped structure.

Figure 8B:
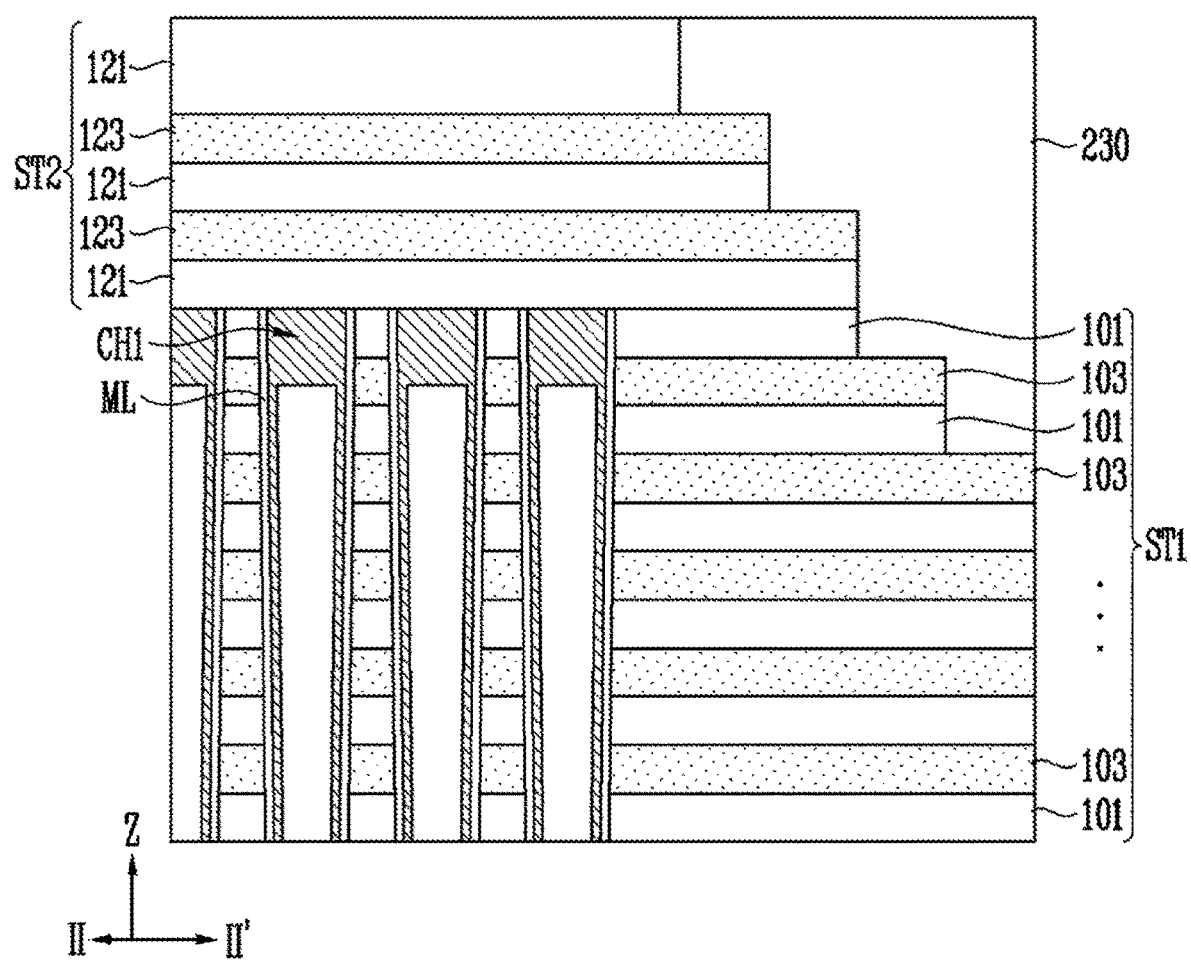

FIGS. 8A and 8B are cross-sectional diagrams illustrating a forming method of the first stack structure ST1 and the second stack structure ST2 according to an embodiment. FIGS. 8A and 8B are cross-sectional diagrams in accordance with steps of a process, which are taken along line II-II' shown in FIGS. 3A and 3B.

Referring to FIG. 8A, after alternately stacking the first material layers 101 and the second material layers 103 in the first direction Z, the first channel structures CH1 passing through the first material layers 101 and the second material layers 103 may be formed.

The first material layers 101 and the second material layers 103 may include the materials described with reference to FIG. 7A. The first channel structures CH1 may be surrounded with the multilayer ML that is disposed on a surface of each of the first holes H1. The first channel structures CH1 may be formed by using the processes described with reference to FIG. 7A.

Subsequently, the third material layer 121 and the fourth material layer 123 may be alternately stacked above the first material layers 101 and the second material layers 103 which surround the first channel structures CH1.

According to an embodiment, a double layered structure including the third material layer 121 and the fourth material layer 123 may be formed above the first material layers 101 and the second material layers 103. According to an embodiment, a triple layered structure and a multiple layered structure including the third material layers 121 and the fourth material layers 123 which are alternately stacked on each other may be formed above the first material layers 101 and the second material layers 103.

The third material layer 121 and the fourth material layer 123 may include the materials described with reference to FIG. 7B.

Referring to FIG. 8B, the first stack structure ST1 and the second stack structure ST2 may be formed by etching the first, second, third and fourth material layers 101, 103, 121, and 123. The first stack structure ST1 may include the first material layers 101 and the second material layers 103 which are etched to have a stepped structure. The second stack structure ST2 may include the third material layer 121 and the fourth material layers 123 which are etched to expose the stepped structure of the first stack structure ST1. When the second stack structure ST2 has a triple layered structure or a multiple layered structure which includes the third material layers 121 and the fourth material layers 123, the third material layers 121 and the fourth material layers 123 may be etched to have a stepped structure.

Subsequently, an upper insulating layer 230 covering the stepped structures of the first stack structure ST1 and the second stack structure ST2 may be formed. The upper insulating layer 230 may include an oxide layer. A surface of the upper insulating layer 230 may be planarized.

The second stack structure ST2 may be formed above the first stack structure ST1 penetrated by the first channel structures CH1 by using the processes described with reference to FIGS. 7A to 7C, or the processes described with reference to FIGS. 8A and 8B. The stepped structure of each of the first stack structure ST1 and the second stack structure ST2 may be covered by the upper insulating layer 130 or 230.

Figure 9A:
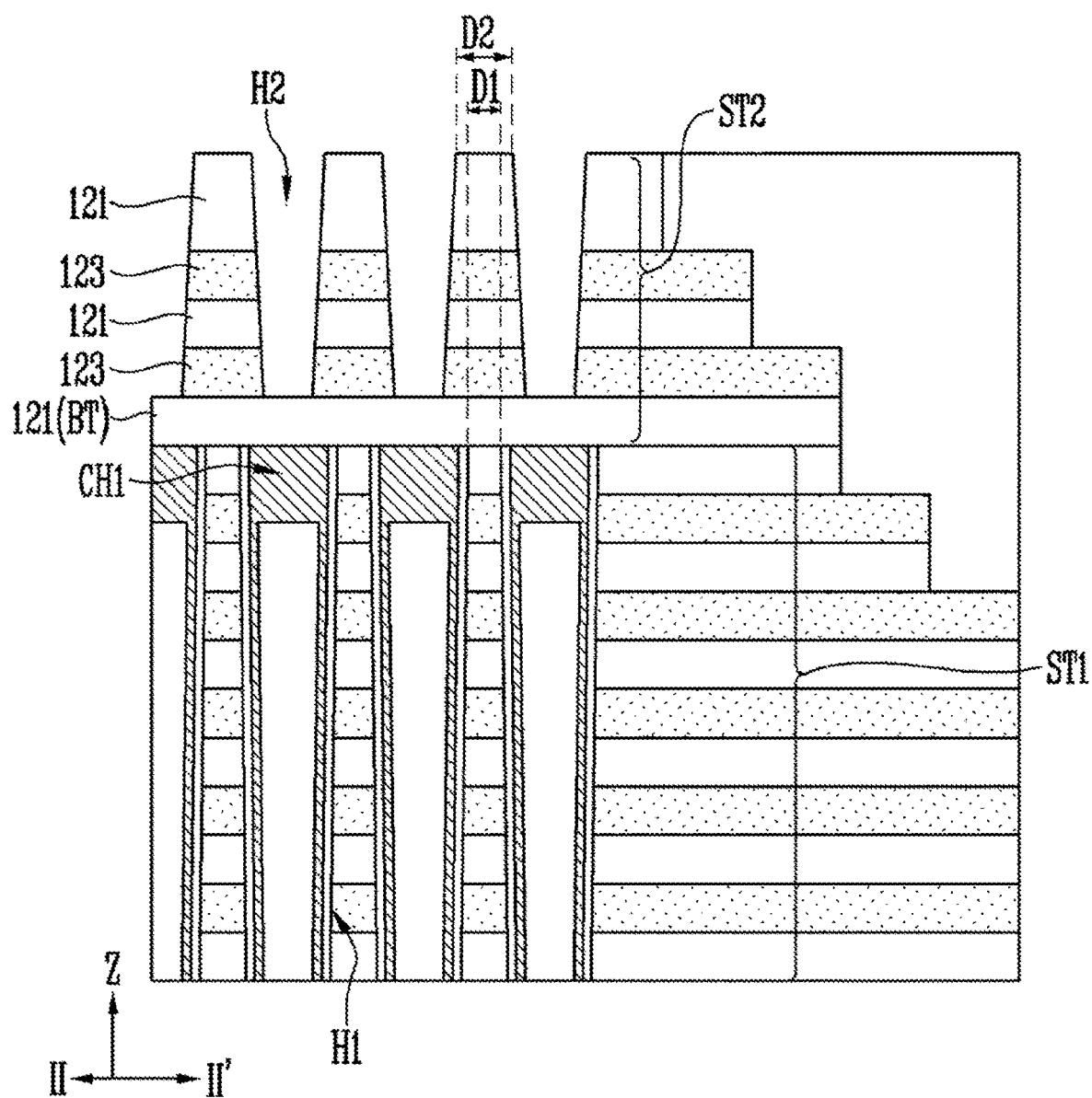
FIGS. 9A and 9B are cross-sectional diagrams illustrating a forming method of second channel structures according to an embodiment.
Figure 9B:
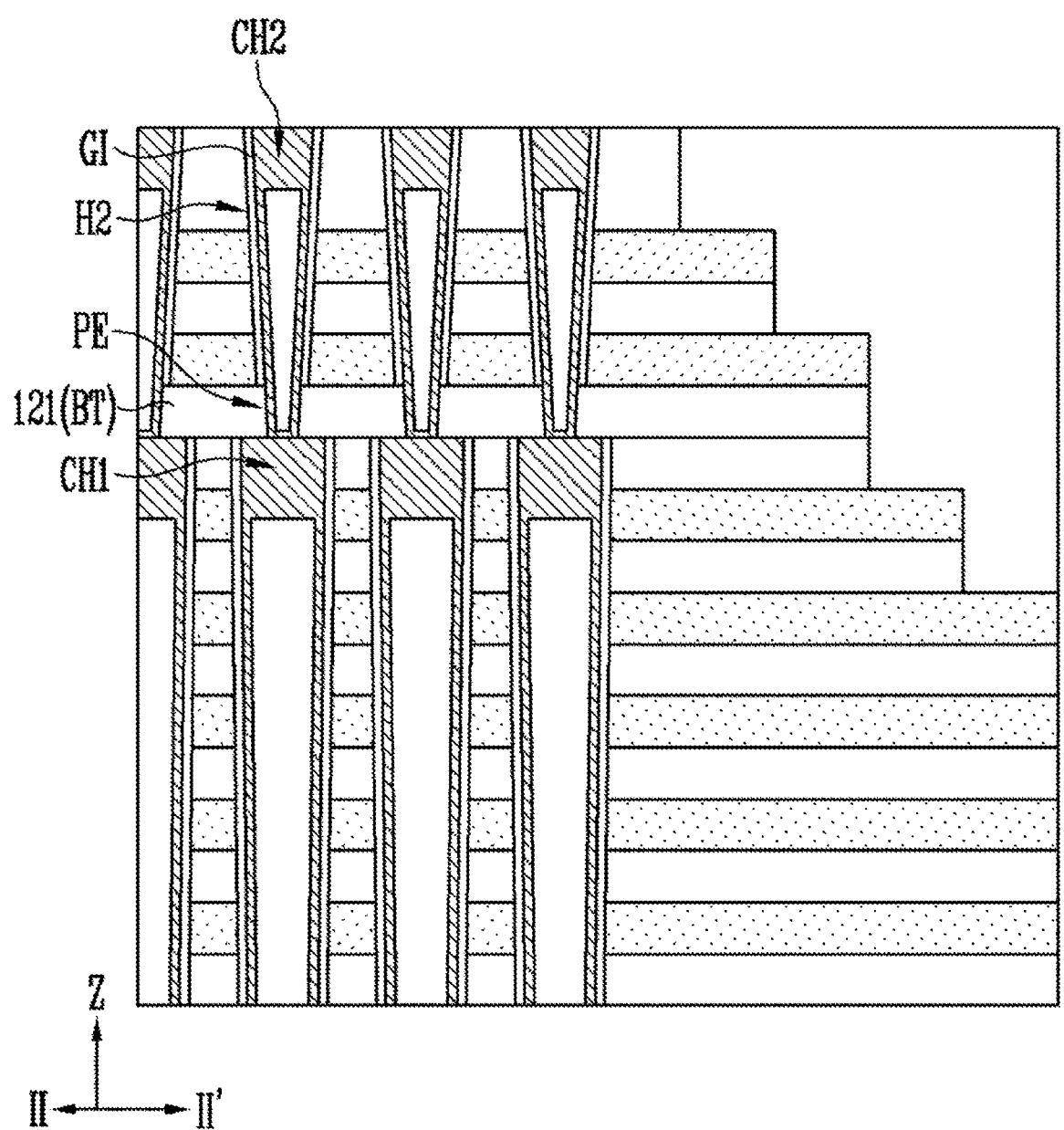

FIGS. 9A and 9B are cross-sectional diagrams illustrating a forming method of the second channel structures CH2 according to an embodiment. Processes to be described later will be performed after the process illustrated in FIG. 7C or the process illustrated in FIG. 8B. FIGS. 9A and 9B are cross-sectional diagrams in accordance with steps of a process, which are taken along line II-II' shown in each of FIGS. 3A and 3B.

Referring to FIG. 9A, second holes H2 may be formed by etching the second stack structure ST2 to expose each of the fourth material layers 123 included in the second stack structure ST2. The second holes H2 may overlap with the first channel structures CH1, respectively. In an embodiment, the second holes H2 may overlap with the first channel structures CH1 in a one-to-one manner, whereby a single second hole 2 overlaps with a single first channel structure CH1. According to an embodiment, each of the second holes H2 may have a depth that exposes an upper surface of a lowermost layer BT disposed at the lowermost layer of the second stack structure ST2 as shown in FIG. 9A. The lowermost layer BT may be the third material layer 121. Although not illustrated in FIG. 9A, according to an embodiment, the second holes H2 may expose the first channel structures CH1, respectively.

The second stack structure ST2 according to an embodiment may include material layers whose number is less than the number of material layers of the first stack structure ST1, and may have a less height than the first stack structure ST1. Accordingly, each of the second holes H2 may have a less length than each of the first holes H1. Each of the second holes H2 which has a relatively small length may be easily formed to have a target depth even when each of the second holes H2 is formed to have a smaller width than each of the first holes H1. A width of the uppermost end of each of the second holes H2 according to an embodiment may be smaller than a width of the uppermost end of each of the first holes H1. A minimum distance D2 between the second holes H2 may be greater than a minimum distance D1 between the first holes H1.

Referring to FIG. 9B, the gate insulating layer GI may be formed on a surface of each of the second holes H2. Subsequently, the gate insulating layer GI may be etched to be removed from a bottom surface of each of the second holes H2. To etch and remove the gate insulating layer GI, forming a sacrificial spacer on a sidewall of each of the second holes H2 and etching the gate insulating layer GI using the sacrificial spacer as an etching barrier may be included. The lowermost layer BT of the second stack structure may be etched by an etching process using the sacrificial spacer as the etching barrier. Accordingly, the first channel structures CH1 may be exposed. The sacrificial spacer may include a semiconductor material, for example, a silicon layer. According to an embodiment, the sacrificial spacer may be removed after exposing the first channel structures CH1. According to an embodiment, the sacrificial spacer may remain and serve as a portion of the second channel structures CH2.

The second channel structures CH2 may be disposed in an extended portion PE of each of the second holes H2 exposing the first channel structures CH1 and may extend on the gate insulating layer GI. The second channel structures CH2 may be coupled to the first channel structures CH1, respectively. In an embodiment, the second channel structures CH2 may be coupled to the first channel structures CH1 in a one-to-one manner whereby a single second channel structure CH2 is coupled to a single first channel structure CH1. Each of the second channel structures CH2 may have the same structure as described above with reference to FIG. 5B.

Figure 10:
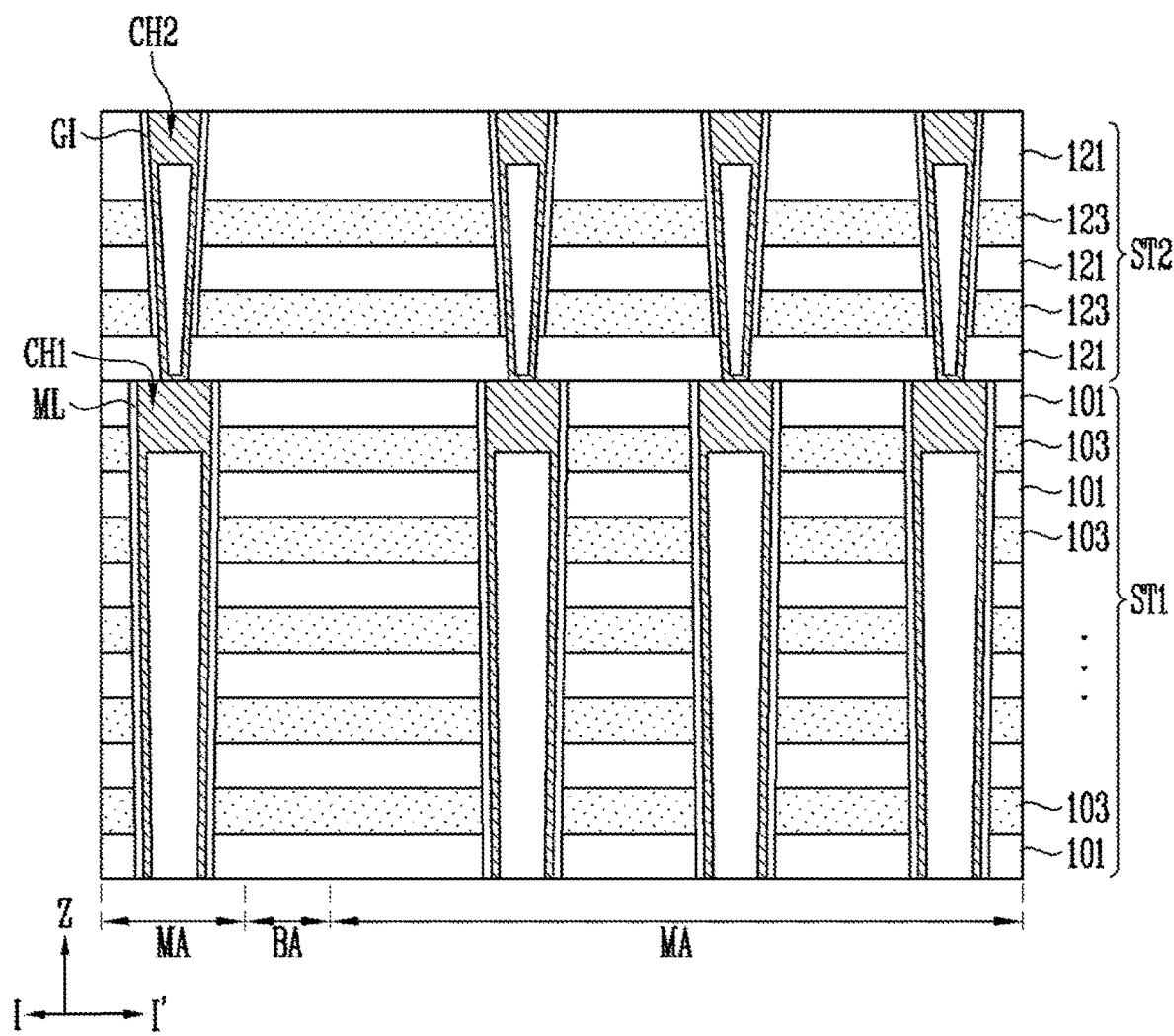
FIG. 10 is a cross-sectional diagram of the first stack structure and the second stack structure, which are formed by processes as described above with reference to FIGS. 9A and 9B.

FIG. 10 is a cross-sectional diagram of the first stack structure ST1 and the second stack structure ST2, which are formed by the processes as described above with reference to FIGS. 9A and 9B. FIG. 10 shows the cross-sectional diagram of the first stack structure ST1 and the second stack structure ST2 taken along line I-I' shown in each of FIGS. 3A and 3B.

Referring to FIG. 10, the second stack structure ST2 penetrated by the second channel structures CH2 may be formed above the first stack structure ST1 penetrated by the first channel structures CH1 by using the processes as described above with reference to FIGS. 7A to 7C, 9A and 9B, or the processes as described above with reference to FIGS. 8A, 8B, 9A, and 9B.

The first stack structure ST1 may include the first material layers 101 and the second material layers 103. The first material layers 101 and the second material layers 103 may be alternately stacked on each other in the first direction Z, and may surround the first channel structures CH1. The multilayer ML may be disposed between the first stack structure ST1 and each of the first channel structures CH1.

The second stack structure ST2 may include at least one third material layer 121 and at least one fourth material layer 123. Each of the third material layers 121 and the fourth material layers 123 may surround the second channel structures CH2 coupled to the first channel structures CH1. The gate insulating layer GI may be disposed between the second stack structure ST2 and each of the second channel structures CH2.

Each of the first stack structure ST1 and the second stack structure ST2 may include main regions MA and a boundary region BA disposed between the main regions MA that neighbor each other. The main regions MA may correspond to the memory blocks BLK shown in FIGS. 3A and 3B, and the boundary region BA may correspond to a region between the memory blocks BLK.

A distance between the first channel structures CH1 neighboring each other with the boundary region BA interposed therebetween may be greater than a distance between the first channel structures CH1 in each of the main regions MA. A distance between the second channel structures CH2 neighboring each other with the boundary region BA interposed therebetween may be greater than a distance between the second channel structures CH2 in each of the main regions MA. Accordingly, a space to which a third slit that is formed later and that is relatively long is disposed may be sufficiently secured at the boundary region BA.

FIGS. 11A to 11F are cross-sectional diagrams illustrating a separating process of electrode patterns according to an embodiment. FIGS. 11A to 11F illustrate an embodiment of subsequent processes after forming the structure as shown in FIG. 10 when the second and fourth material layers include sacrificial materials. FIGS. 11A to 11F are cross-sectional diagrams in accordance with steps of a process, which are taken along line I-I' of each of FIGS. 3A and 3B.

Figure 11A:
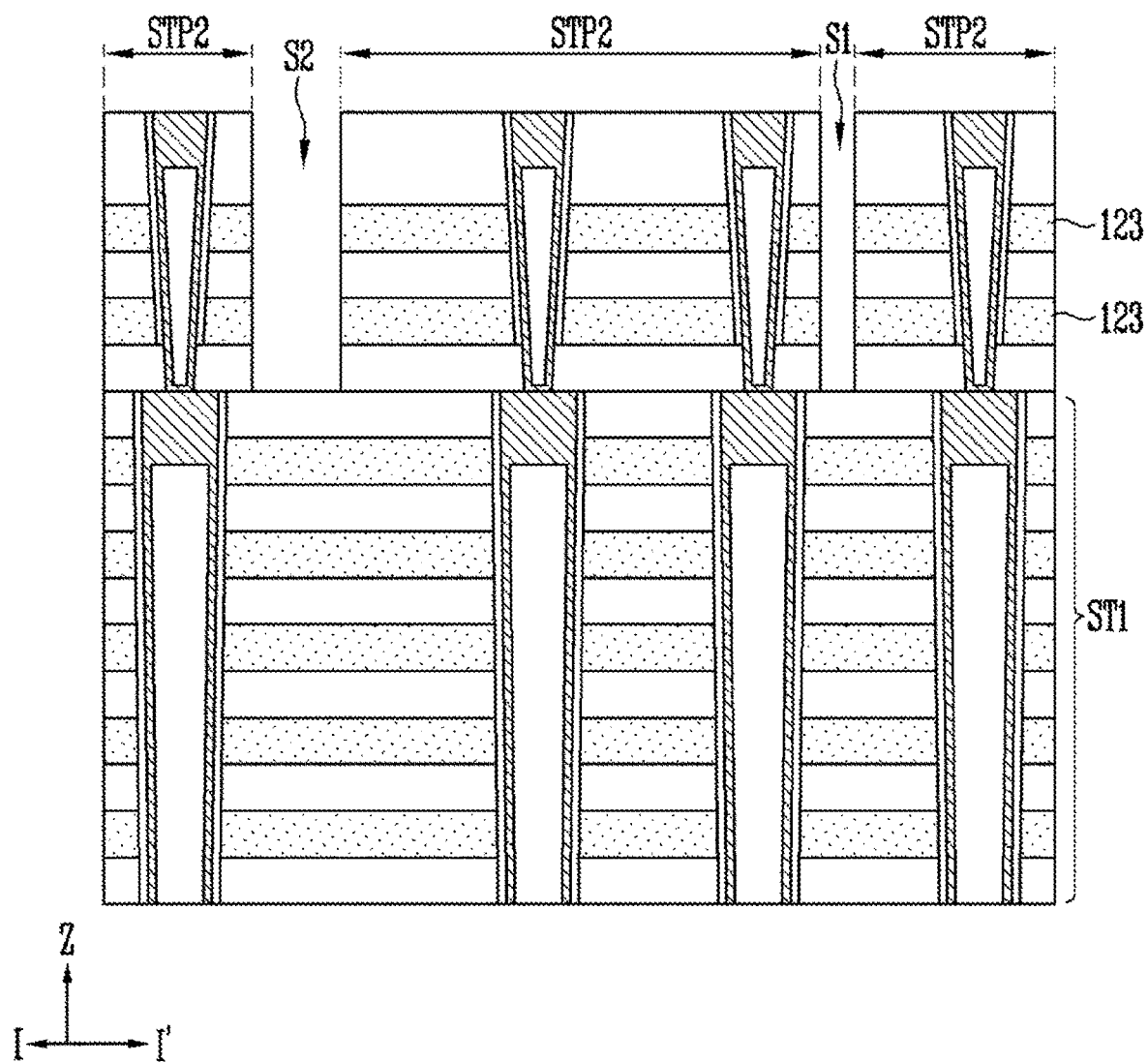
FIGS. 11A to 11F are cross-sectional diagrams illustrating a separating process of electrode patterns according to an embodiment.

Referring to FIG. 11A, the first slits S1 and the second slits S2 which pass through the second stack structure ST2 shown in FIG. 10 may be formed. The arrangement of the first slits S1 and the second slits S2 may be the same as described above with reference to FIG. 3A. The first slits S1 may pass through the main regions MA of the second stack structure ST2 shown in FIG. 10. Each of the second slits S2 may pass through the boundary region BA of the second stack structure ST2 of FIG. 10 which corresponds to the second slit S2.

The second stack structure ST2 shown in FIG. 10 may be divided into second stack patterns STP2 by the first slits S1 and the second slits S2 in accordance with the process as described above. Each of the first slits S1 may be narrower than each of the second slits S2. According to an embodiment, the first slits S1 may have a length that passes through the second stack structure ST2 which have a smaller thickness than the first stack structure ST1, but that does not pass through the first stack structure ST1. Because a length of each of the first slits S1 is small, a space to which the first slits S1 is disposed is sufficiently secured in a narrow region between the second channel structures CH2.

Each of the second slits S2 may have a greater width than the first slits S1 considering a width of each of the third slits to be formed in the second slits S2 during a subsequent process.

Figure 11B:
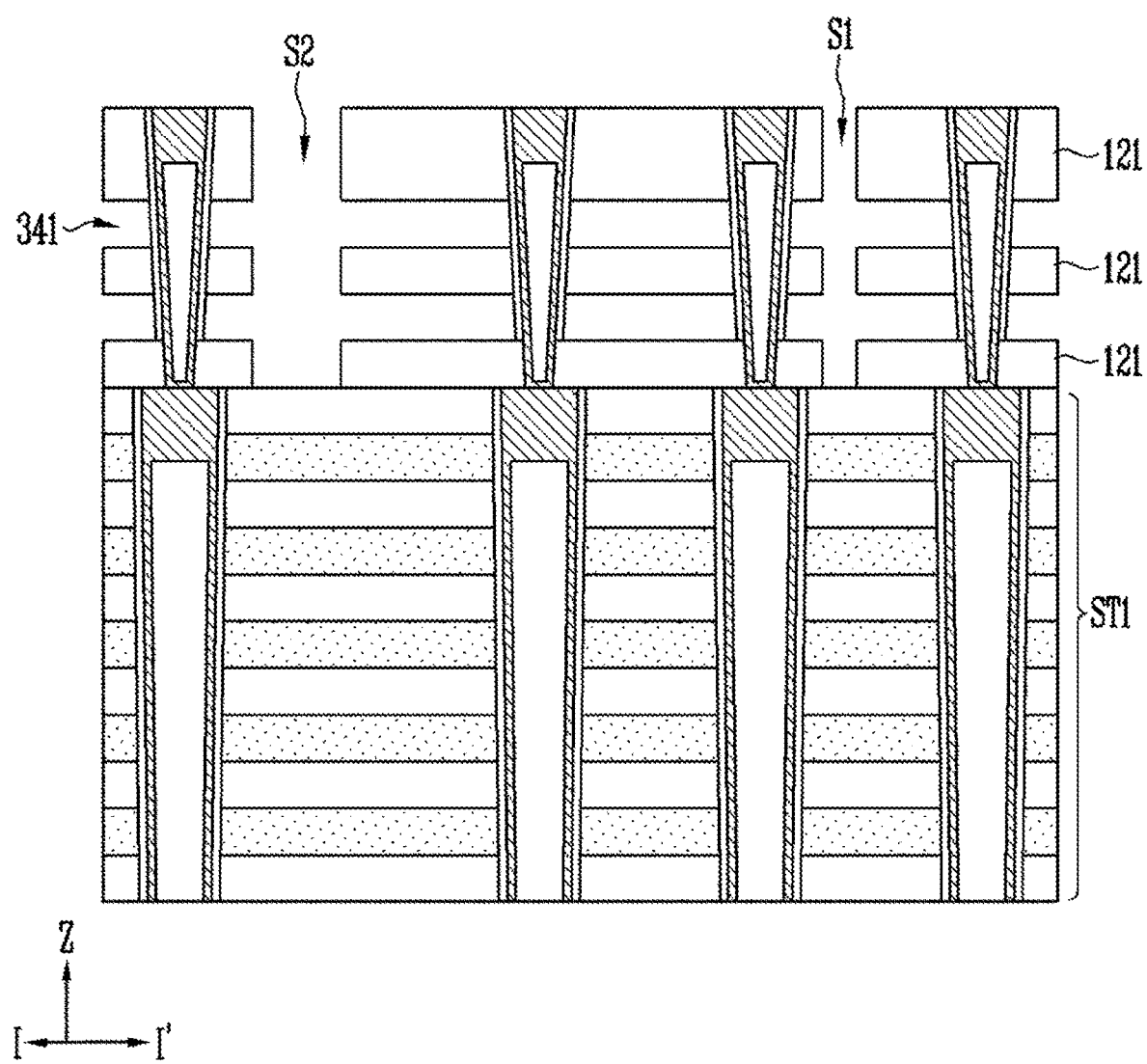

Referring to FIG. 11B, first interlayer spaces 341 may be opened by removing the fourth material layers 123 shown in FIG. 11A through the first slits S1 and the second slits S2. The first interlayer spaces 341 may be defined between the third material layers 121 neighboring each other in the first direction Z.

Figure 11C:
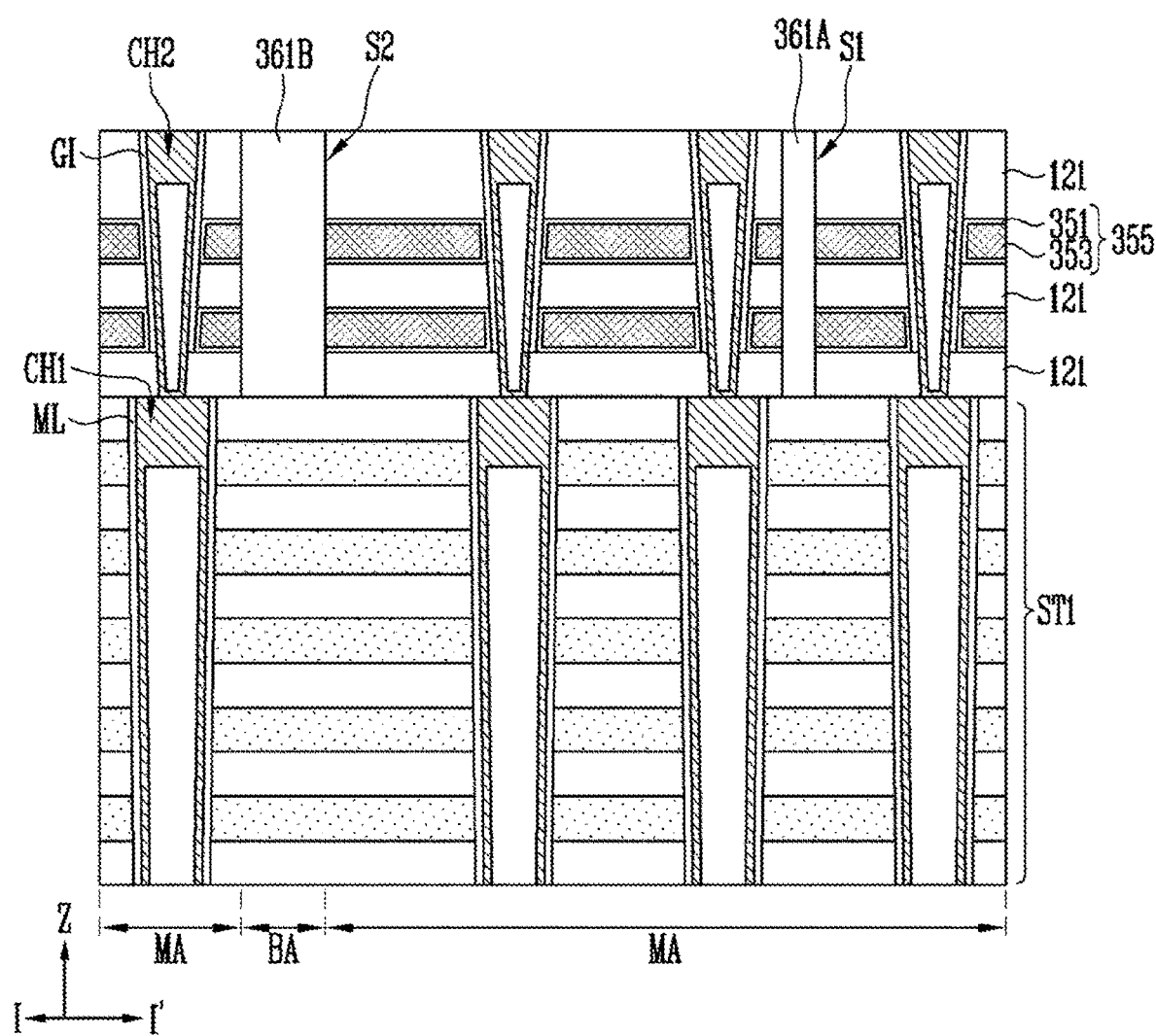

Referring to FIG. 11C, the first interlayer spaces 341 shown in FIG. 11B may be filled with electrode patterns 355, respectively, through the first slits S1 and the second slits S2. The electrode patterns 355 shown in FIG. 11C may correspond to the second electrode patterns EP2 shown in FIGS. 4A and 4B. Each of the electrode patterns 355 may include a conductive layer 353 and a liner layer 351. The liner layer 351 may correspond to the second liner layer LL2 shown in FIG. 5B, and the conductive layer 353 may correspond to the second conductive layer CP2 shown in FIG. 5B. The electrode patterns 355 may be separated from each other by the first slits S1 and the second slits 52 which have different widths from each other and may surround the second channel structures CH2.

Forming the electrode patterns 355 may include forming the liner layer 351 along a surface of the first interlayer spaces 341 shown in FIG. 11B, forming the conductive layer 353 which fills the first interlayer spaces 341 on the liner layer 351, and dividing the liner layer 351 and the conductive layer 353 into a plurality of the electrode patterns 355. The liner layer 351 of each of the electrode patterns 355 may have a cross-sectional structure opened towards the first slits S1 or the second slits S2, and may extend along the sidewall of each of the second channel structures CH2. The liner layers 351 may be disposed on the sidewalls of the respective second channel structures with the gate insulating layer GI interposed therebetween.

The conductive layer 353 may include metal. In an embodiment, the liner layer 351 may include a barrier layer to mitigate metal from diffusing from the conductive layer 353 into the gate insulating layer GI and the third material layer 121. The barrier layer may include a metal nitride layer. The liner layer 351 may further include an insulating thin film disposed between the barrier layer and the conductive layer 353 as described above with reference to FIG. 5B.

Subsequently, the first slits S1 or the second slits S2 which are exposed between the electrode patterns 355 may be filled with an insulating material. The insulating material may cover sidewalls of the electrode patterns 355. According to an embodiment, the insulating material may completely fill the first slits S1 and the second slits S2 which have different widths from each other. The insulating material may include various materials, for example, an oxide layer.

An insulating material filling each of the first slits S1 may serve as a separation insulating layer 361A and an insulating material filling each of the second slits S2 may serve as a slit insulating layer 361B. The slit insulating layer 361B may be disposed between the memory blocks and the separation insulating layer 361A may separate drain select lines included in each of the memory blocks from each other.

Each of the main regions MA of the first stack structure ST1 may overlap at least one separation insulating layer 361A. The boundary region BA of the first stack structure ST1 may overlap the corresponding slit insulating layer 361B.

Figure 11D:
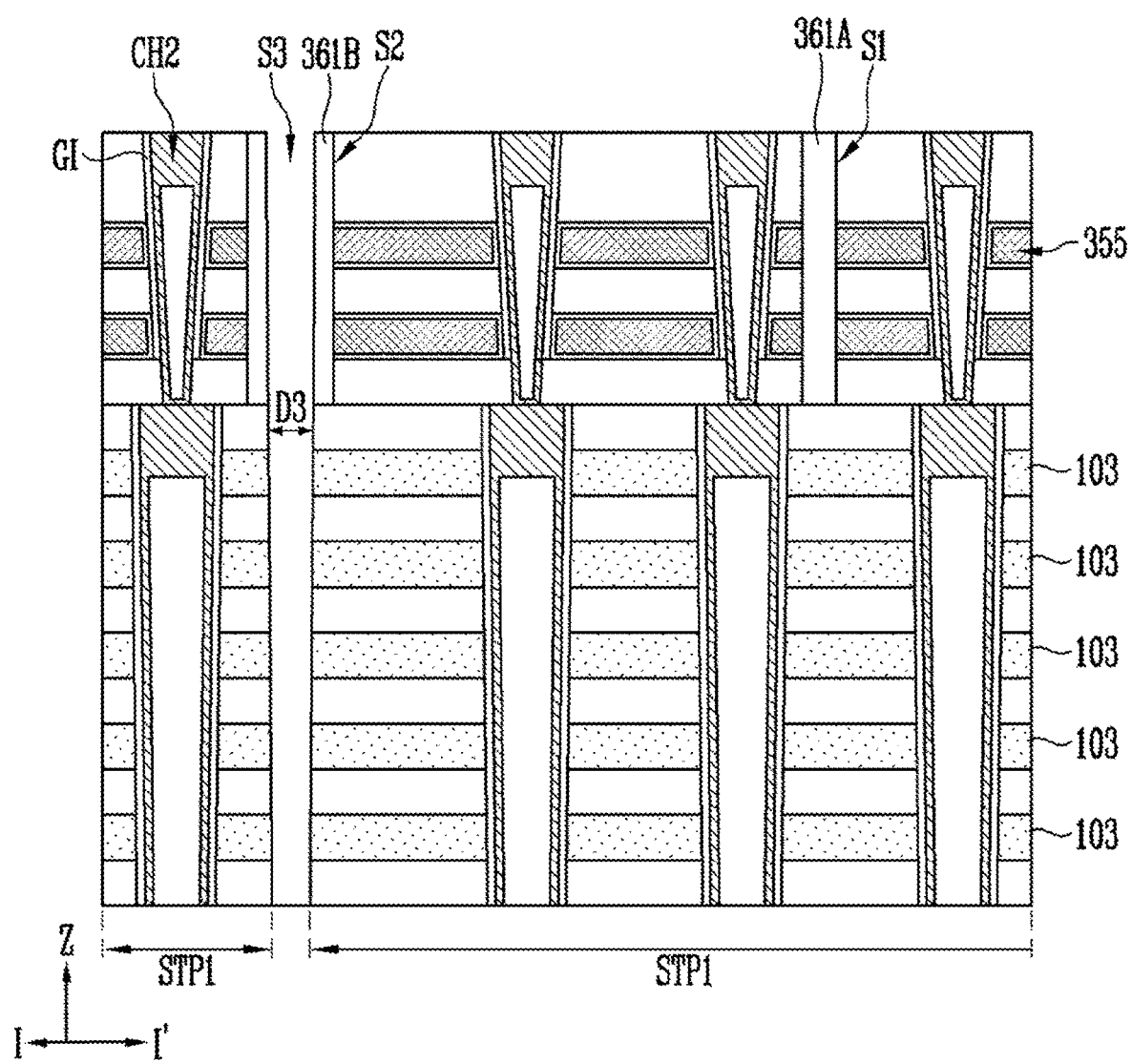

Referring to FIG. 11D, the third slits S3 passing through the slit insulating layer 361B in each of the second slits S2 and extending to pass through the first stack structure ST1 shown in FIG. 11C may be formed. Each of the third slits S3 may pass through the boundary region BA of FIG. 11C corresponding to each of the third slits S3.

The first stack structure ST1 may be divided into a plurality of first stack patterns STP1 by the third slits S3. The third slits S3 may be disposed in the second slits S2 that have a relatively great width, respectively, and may have a greater width than the first slits S1. Accordingly, even when each of the third slits S3 has an inclined etched surface and a width of each of the third slits S3 becomes smaller as it closes to the lower portion thereof, the third slits S3 may completely pass through the first stack structure ST1. The second material layers 103 of the first stack patterns STP1 may be exposed by the third slits S3.

A distance D3 between the first stack patterns STP1 may be smaller than the width of the second slit S2. Each of the first stack patterns STP1 may overlap two or more electrode patterns 355 that are disposed on the same horizontal layer and that are spaced apart from each other in a horizontal direction. The two or more electrode patterns 355 that overlap each of the first stack patterns STP1 and that are disposed on the same horizontal layer may be separated from each other in the horizontal direction by at least one of the first slits S1 overlapping the first stack patterns STP1, respectively.

Figure 11E:
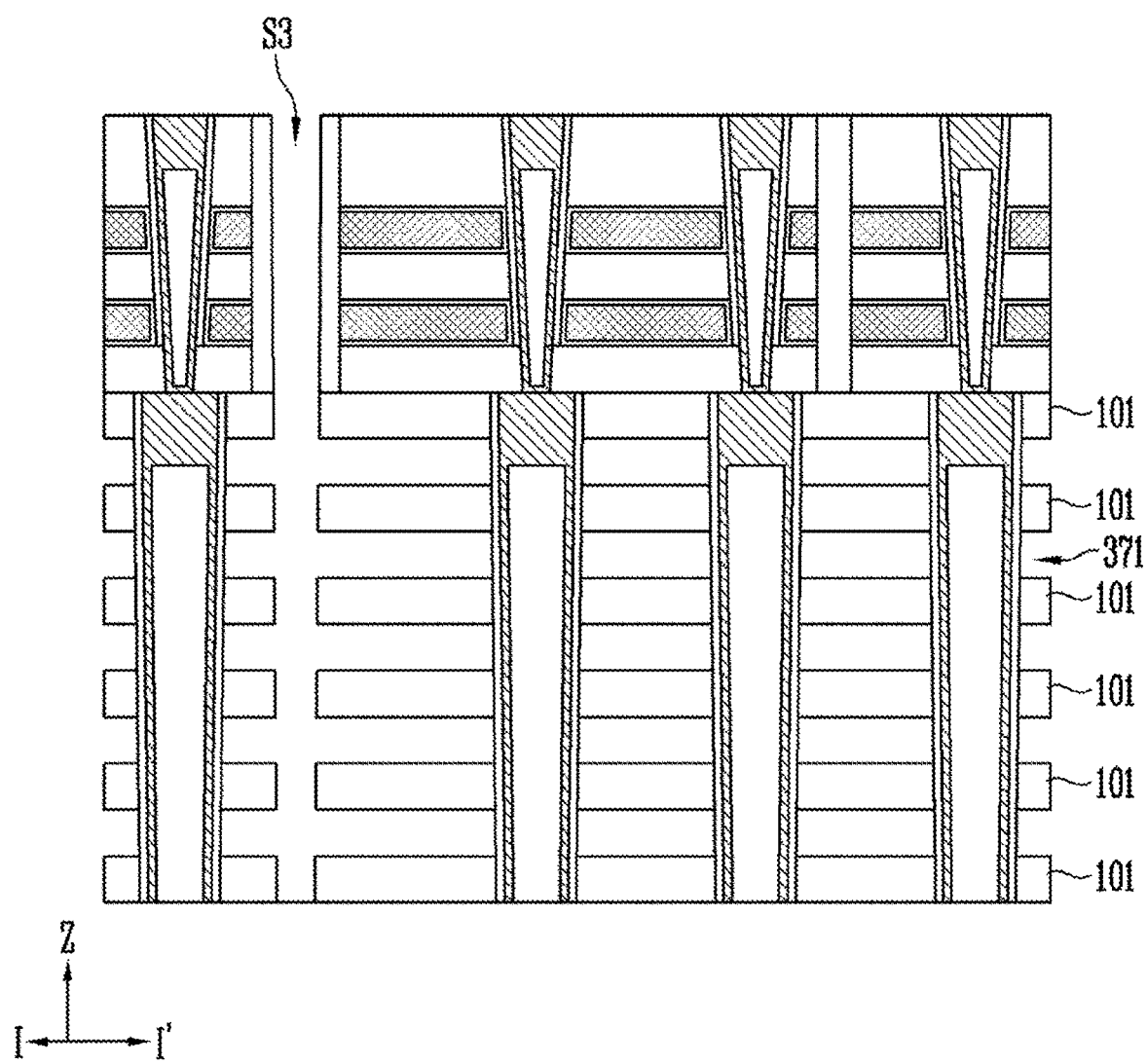

Referring to FIG. 11E, second interlayer spaces 371 may be opened by removing the second material layers 103 shown in FIG. 11D through the third slits S3. The second interlayer spaces 371 may be defined between the first material layers 101 adjacent to each other in the first direction Z.

Figure 11F:
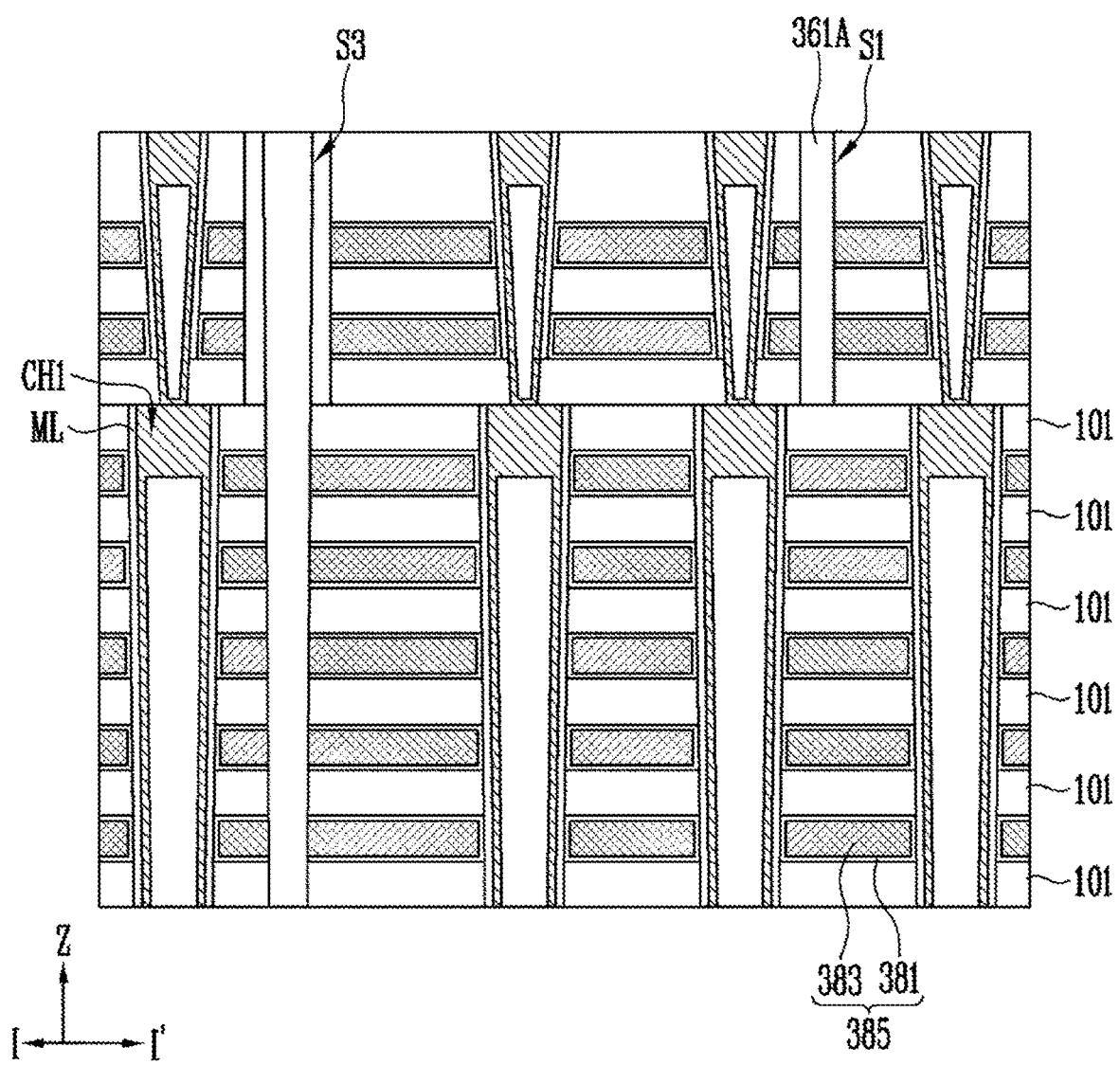

Referring to FIG. 11F, the second interlayer spaces 371 shown in FIG. 11E may be filled with lower electrode patterns 385, respectively, through the third slits S3. The lower electrode patterns 385 shown in FIG. 11F may correspond to the first electrode patterns EP1 as shown in FIGS. 4A and 4B. Each of the lower electrode patterns 385 may include a conductive layer 383 and a liner layer 381. The liner layer 381 may correspond to the first liner layer LL1 as shown in FIG. 5A, and the conductive layer 383 may correspond to the first conductive layer CP1 as shown in FIG. 5A. The lower electrode patterns 385 may be separated from each other by the third slits S3 and may surround the first channel structures CH1.

Forming the lower electrode patterns 385 may include forming the liner layer 381 along a surface of the second interlayer spaces 371 shown in FIG. 11E, forming the conductive layer 383 filling the second interlayer spaces 371 on the liner layer 381, and dividing the liner layer 381 and the conductive layer 383 into the plurality of lower electrode patterns 385. The liner layer 381 of each of the lower electrode patterns 385 may have a cross-sectional structure opened towards the third slits S3, and may extend along a sidewall of each of the first channel structures CH1. The liner layer 381 may be disposed on the sidewall of each of the first channel structures CH1 with the multilayer ML interposed therebetween.

The conductive layer 383 may include metal. In an embodiment, the liner layer 381 may include a barrier layer which mitigates metal from diffusing from the conductive layer 383 into the multilayer ML and the first material layer 101. The barrier layer may include a metal nitride layer. The liner layer 381 may further include a blocking insulating layer disposed between the barrier layer and the conductive layer 383 as described above with reference to FIG. 5A.

Subsequently, the third slits S3 exposed between the lower electrode patterns 385 may be filled with a vertical structure 391. According to an embodiment, forming the vertical structure 391 may include completely filling each of the third slits S3 with an insulating material. According to an embodiment, forming the vertical structure 391 may include forming an insulating material on a sidewall of each of the third slits S3, and filling a central area of each of the third slits S3 which is opened by the insulating material with a vertical conductive pattern. The vertical structure 391 may include a vertical conductive pattern surrounded with the insulating material.

According to an embodiment, a defect in which an electrode material remains in the first slits S1 that have a small width may be mitigated by replacing the second material layers with the lower electrode patterns 385 after filling each of the first slits S1 that has a relatively small width with the separation insulating layer 361A.

Figure 12A:
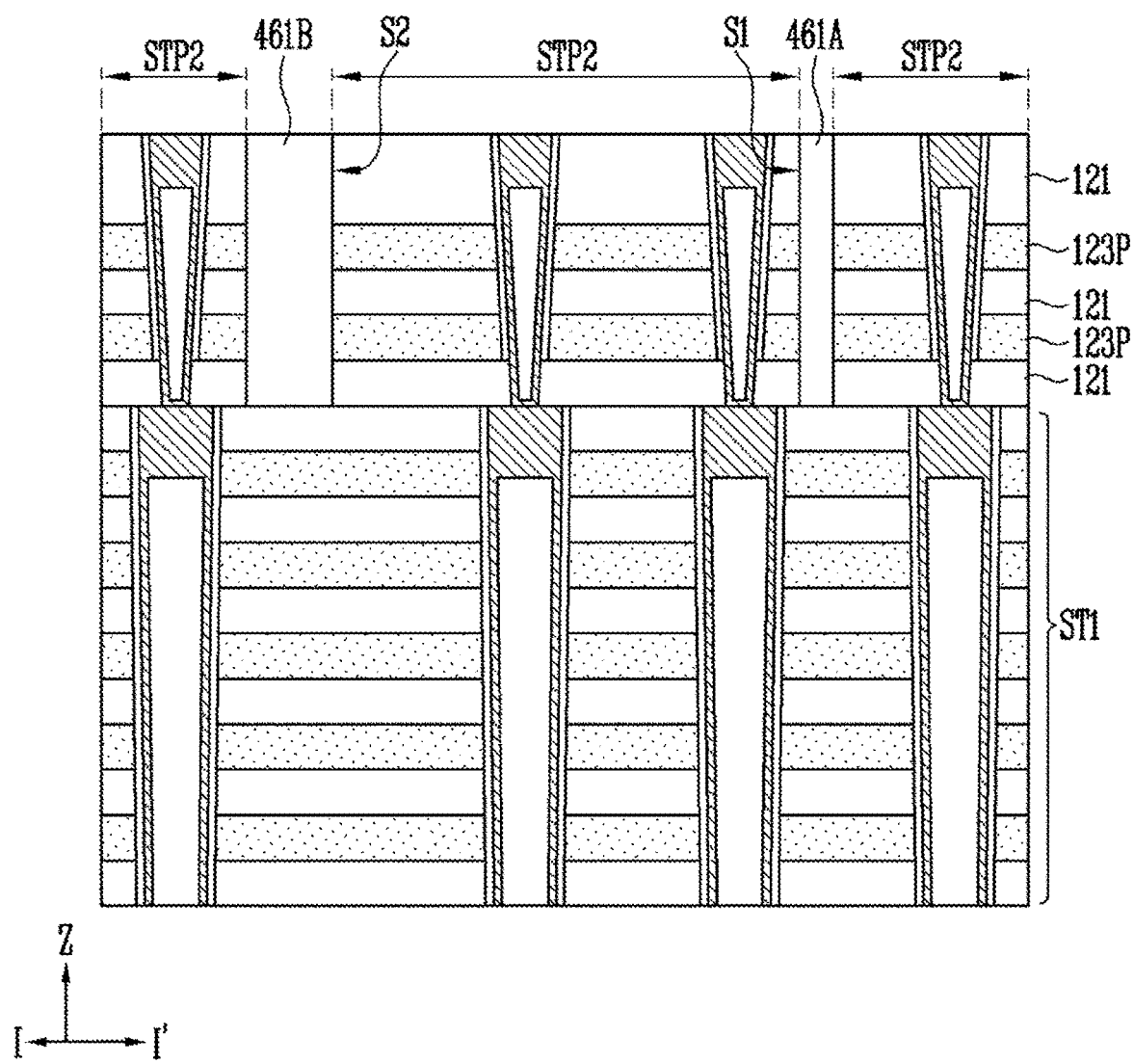
FIGS. 12A and 12B are cross-sectional diagrams illustrating a separating process of electrode patterns according to an embodiment.
Figure 12B:
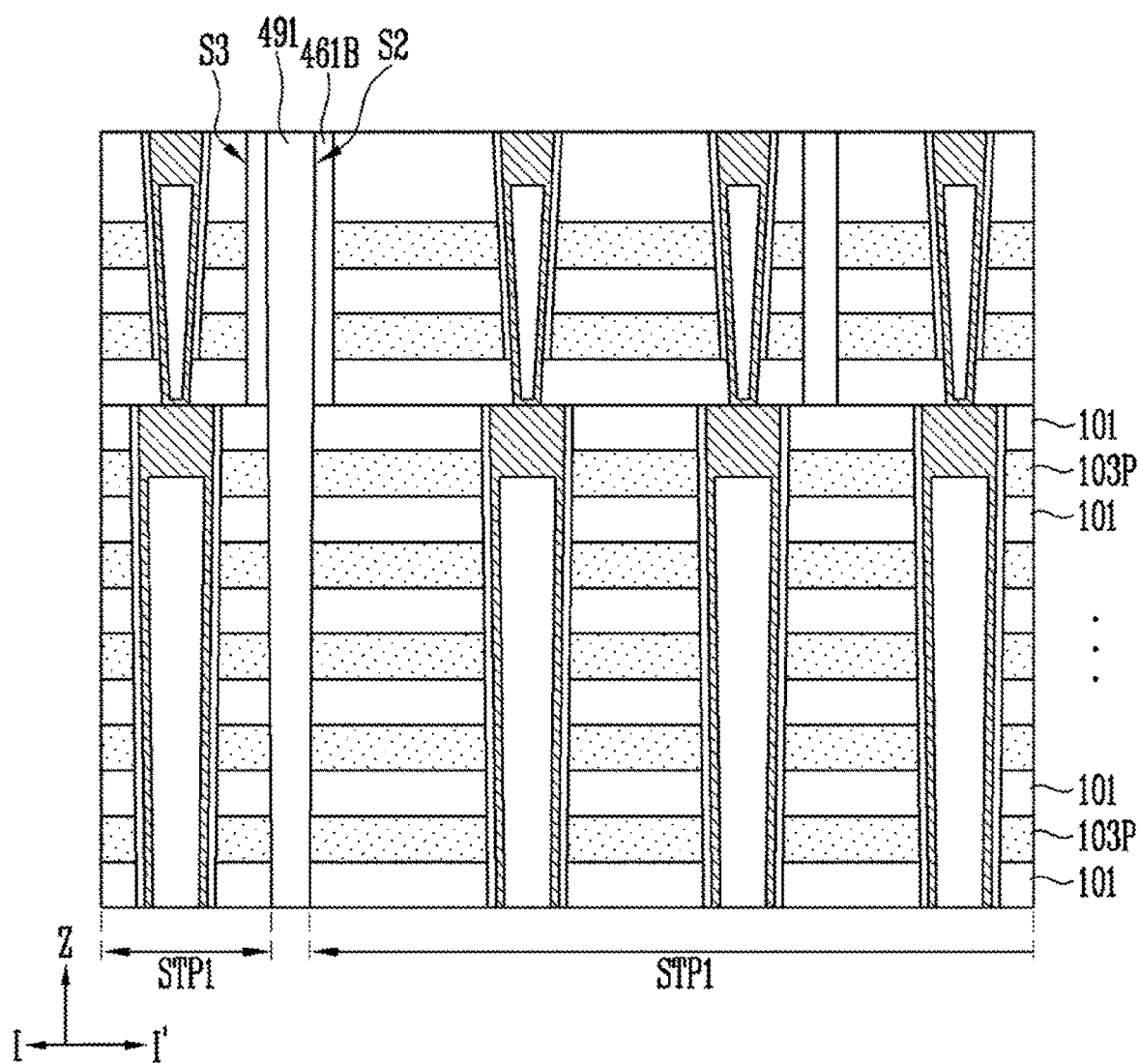

FIGS. 12A and 12B are cross-sectional diagrams illustrating a separating process of electrode patterns according to an embodiment. FIGS. 12A and 12B illustrate an embodiment of subsequent processes when second and fourth material layers include a conductive layer, after the structure as shown in FIG. 10 is formed. FIGS. 12A and 12B are cross-sectional diagrams in accordance with steps of a process, which are taken along line I-I' of each of FIGS. 3A and 3B.

Referring to FIG. 12A, the first slits S1 and the second slits S2 which pass through the second stack structure ST2 shown in FIG. 10 may be formed as described above with reference to FIG. 11A. Thereby, the second stack structure ST2 shown in FIG. 10 may be divided into the second stack patterns STP2 by the first slits S1 and the second slits S2 as described above with reference to FIG. 11A.

The fourth material layers 123 as shown in FIG. 10 may be divided into electrode patterns 123P by the first slits S1 and the second slits S2. Subsequently, the first slits S1 or the second slits S2 which are exposed between the electrode patterns 123P may be filled with an insulating material. Before forming the insulating material, a metal silicide layer may be formed by silicidating each of the electrode patterns 123P by a silicidating process through the first slits S1 and the second slits S2.

The insulating material filling the first slits S1 and the second slits S2 may cover sidewalls of the electrode patterns 123P. According to an embodiment, the insulating material may completely fill the first slits S1 and the second slits S2 which have different widths from each other. The insulating material may include various materials, for example, an oxide layer.

An insulating material filling each of the first slits S1 may serve as a separation insulating layer 461A as described above with reference to FIG. 11C, and an insulating material filling each of the second slits S2 may serve as a slit insulating layer 461B as described above with reference to FIG. 11C. The slit insulating layer 461B may be disposed between the memory blocks, and the separation insulating layer 461A may separate drain select lines included in each of the memory blocks from each other.

Referring to FIG. 12B, the third slits S3 passing through the slit insulating layer 461B in each of the second slits S2 may be formed as described above with reference to FIG. 11D. The third slits S3 may extend to pass through the first stack structure ST1 shown in FIG. 12A.

The first stack structure ST1 may be divided into the plurality of first stack patterns STP1 by the third slits S3 as described above with reference to FIG. 11D.

The second material layers 103 shown in FIG. 10 may be separated into lower electrode patterns 103P by the third slits S3. Subsequently, each of the third slits S3 exposed between the lower electrode patterns 103P may be filled with a vertical structure 491. Before forming the vertical structure 491, a metal silicide layer may be formed by silicidating each of the lower electrode patterns 103P by a silicidating process through the third slits. The vertical structure 491 may include an insulating material, or a vertical conductive pattern and an insulating material surrounding the vertical conductive pattern.

According to embodiments, process margins of the third slits S3 need not be considered because the first slits S1 and the second slits S2 which have a relatively small length are formed by a separate process from the third slits S3 which have a relatively great length. Accordingly, according to embodiments, the first slits S1 may have a small width. Thereby, a size of the memory block may be decreased because a distance between the second channel structures CH2 spaced apart from each other with each of the first slits S1 interposed therebetween is decreased.

The present disclosure may lower a level of difficulty of a manufacturing process of a semiconductor device by separately performing a process of forming a first stack structure penetrated by first channel structures from a process of forming electrode patterns surrounding second channel structures and separated from each other.

Figure 13:
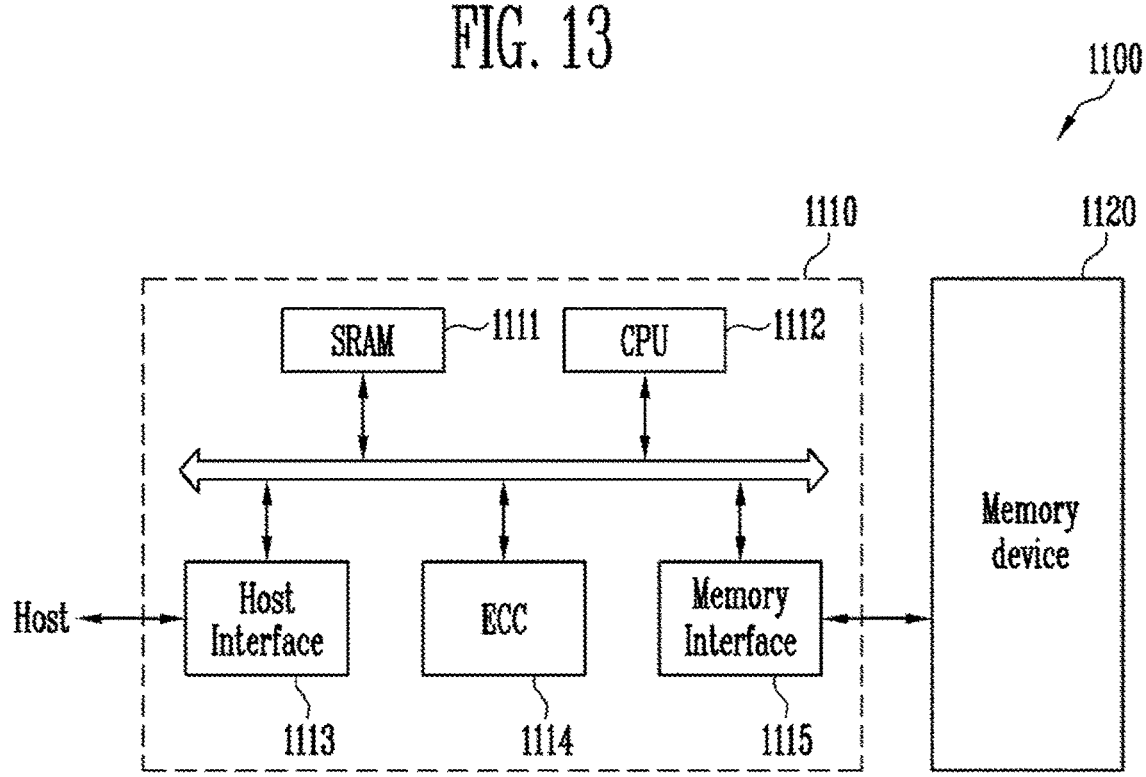
FIG. 13 is a block diagram illustrating a configuration of a memory system according to an embodiment.

FIG. 13 is a block diagram illustrating a configuration of a memory system 1100 according to an embodiment.

Referring to FIG. 13, the memory system 1100 according to an embodiment may include a memory device 1120 and a memory controller 1110.

The memory device 1120 may be a multi-chip package including a plurality of flash memory chips. The memory device 1120 may include at least one of the structures as shown in FIGS. 3A, 3B, 4A, 4B, 5A, 5B, 6A to 6C, and 12B.

The memory controller 1110 may be configured to control the memory device 1120 and include a Static Random Access Memory (SRAM) 1111, a CPU 1112, a host interface 1113, an Error Correction Code (ECC) 1114, and a memory interface 1115. The SRAM 1111 may serve as an operation memory of the CPU 1112, the CPU 1112 may perform overall control operations for data exchange of the memory controller 1110, and the host interface 1113 may include a data exchange protocol of a host accessing the memory system 1100. The ECC 1114 may detect and correct errors included in the data read from the memory device 1120, and the memory interface 1115 may perform interfacing with the memory device 1120. The memory controller 1110 may further include a Read Only Memory (ROM) for storing code data for interfacing with the host.

The memory system 1100 having the above-described configuration may be a Solid State Disk (SSD) or a memory card in which the memory device 1120 and the memory controller 1110 are combined. For example, when the memory system 1100 is an SSD, the memory controller 1110 may communicate with an external device (e.g., a host) through one of the interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer Small Interface (SCSI), an Enhanced Small Disk Interface (ESDI), and Integrated Drive Electronics (IDE).

Figure 14:
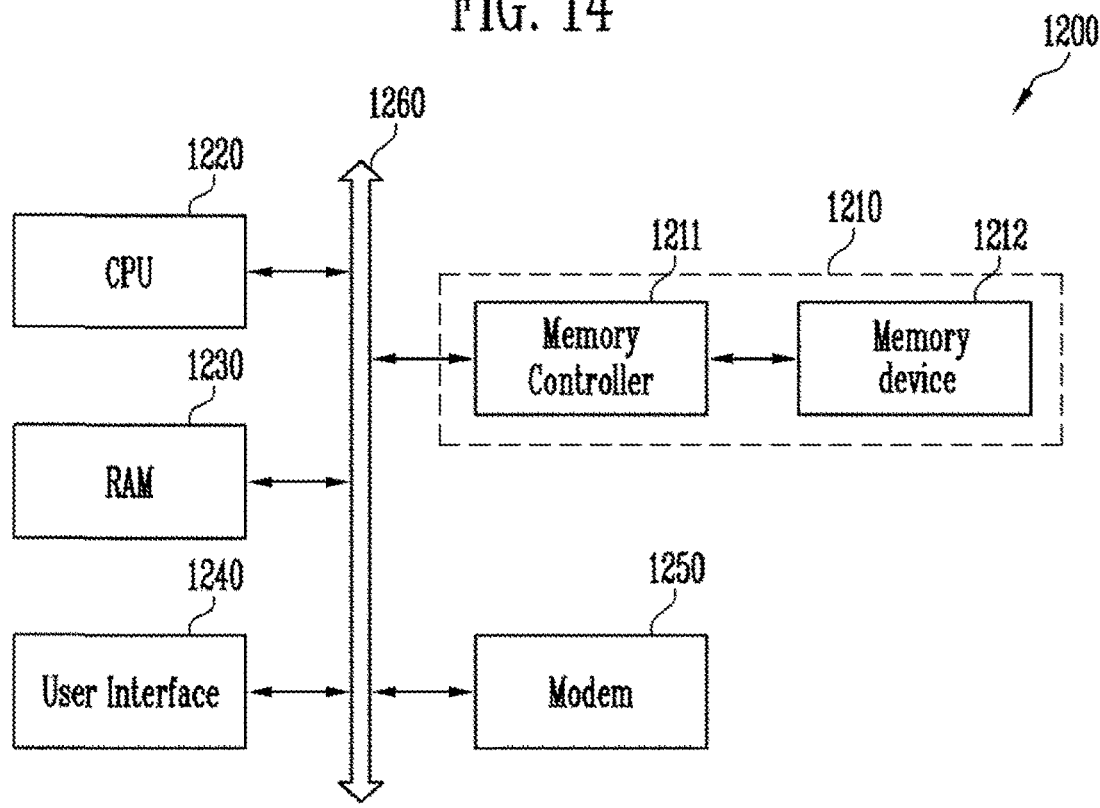
FIG. 14 is a block diagram illustrating a configuration of a computing system according to an embodiment.

FIG. 14 is a block diagram illustrating a configuration of a computing system 1200 according to an embodiment of the present disclosure.

Referring to FIG. 14, the computing system 1200 according to an embodiment may include a CPU 1220, a Random Access Memory (RAM) 1230, a user interface 1240, a modem 1250, and a memory system 1210, which are electrically connected to a system bus 1260. In an embodiment, the memory device 1212 may include at least one of the structures as shown in FIGS. 3A, 3B, 4A, 4B, 5A, 5B, 6A to 6C, and 12B. When the computing system 1200 is a mobile device, a battery for supplying an operating voltage to the computing system 1200 may be further included, and an application chipset, a camera image processor (CIS), a mobile DRAM, and the like may be further included.

The above-discussed embodiments aim to help those with ordinary knowledge in this art more clearly understand the present disclosure rather than aiming to limit the bounds of the present disclosure. It should be understood that many variations and modifications of the concepts described herein will still fall within the spirit and scope of the present disclosure as defined in the accompanying claims and equivalents thereof.

So far as not being differently defined, all terms used herein including technical or scientific terminologies have meanings that they are commonly understood by those skilled in the art to which the present disclosure pertains. So far as not being clearly defined in this application, terms should not be understood in an ideally or excessively formal way.

What is claimed is:

1. A method of manufacturing a semiconductor device, the method comprising:
   forming a first stack structure penetrated by first channel structures;
   forming electrode patterns surrounding second channel structures and separated from each other by first slits and second slits, the second channel structures coupled to the first channel structures, and the second slits comprising a different width from the first slits;
   filling each of the first slits and the second slits with an insulating material to cover sidewalls of the electrode patterns; and
   forming third slits passing through the insulating material in each of the second slits and extending to pass through the first stack structure.

2. The method of claim 1, wherein the first stack structure comprises first material layers and second material layers that are alternately stacked on each other.

3. The method of claim 2, wherein the second material layers comprise a conductive material, and
   wherein the conductive material is separated by the third slits to form lower electrode patterns.

4. The method of claim 2, further comprising replacing the second material layers of the first stack structure exposed through the third slits with lower electrode patterns, respectively.

5. The method of claim 1, wherein at least one of the first slits is disposed between the second slits adjacent to each other.

6. The method of claim 1, wherein each of the first slits has a smaller width than each of the second slits.

7. The method of claim 1, wherein the first stack structure is divided into first stack patterns by the third slits, and wherein a distance between the first stack patterns is smaller than a width of each of the second slits.

8. The method of claim 1, wherein one or more columns of the second channel structures are disposed between the first and second slits adjacent to each other.

9. The method of claim 1, wherein a number of the second channel structures disposed between the first and second slits adjacent to each other is less than a number of the first channel structures disposed between the third slits adjacent to each other.

10. The method of claim 1, wherein the first stack structure is divided into first stack patterns by the third slits, and wherein each of the first stack patterns overlaps two or more electrode patterns disposed in a horizontal direction and separated from each other by at least one of the first slits among the electrode patterns.

11. The method of claim 1, the forming of the electrode patterns comprises:

forming a second stack structure including a third material layer and a fourth material layer that are alternately stacked on each other on the first stack structure;

forming the second channel structures passing through the second stack structure to be coupled to the first channel structures in a one-to-one manner; and forming the first slits and the second slits that divide the second stack structure into second stack patterns.

12. The method of claim 11, wherein the fourth material layer comprises a conductive material included in the electrode patterns.

13. The method of claim 11, the forming of the electrode patterns further comprises:

removing the fourth material layer of each of the second stack patterns through the first slits and the second slits; and forming the electrode patterns filling a region from which the fourth material layer is removed and separated from each other by the first slits or the second slits.

14. A semiconductor device, comprising:

a first gate stack structure including first interlayer insulating layers and first electrode patterns that are alternately stacked on each other;

at least one separation insulating layer disposed on the first gate stack structure;

a slit insulating layer disposed on the first gate stack structure;

second gate stack structures each including a second interlayer insulating layer and a second electrode pattern that are alternately stacked on each other, wherein the second gate stack structures are separated from each other by the separation insulating layer and the slit insulating layer; and a vertical structure passing through the slit insulating layer and the first gate stack structure, wherein the vertical structure includes an insulating material, and wherein a width of the slit insulating layer is greater than a width of the vertical structure.

15. The semiconductor device of claim 14, further comprising:

first channel structures passing through the first gate stack structure; and second channel structures disposed at both sides of the separation insulating layer, coupled to the first channel structures in a one-to-one manner, and passing through the second gate stack structures.

* * * * *